(12) United States Patent
Toda et al.

(10) Patent No.: US 12,094,980 B2
(45) Date of Patent: Sep. 17, 2024

(54) SEMICONDUCTOR DEVICE

(71) Applicant: Japan Display Inc., Tokyo (JP)

(72) Inventors: Tatsuya Toda, Tokyo (JP); Masashi Tsubuku, Tokyo (JP); Toshinari Sasaki, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 399 days.

(21) Appl. No.: 17/483,836

(22) Filed: Sep. 24, 2021

(65) Prior Publication Data
US 2022/0013668 A1  Jan. 13, 2022

Related U.S. Application Data

(63) Continuation of application No. PCT/JP2020/005321, filed on Feb. 12, 2020.

(30) Foreign Application Priority Data

Mar. 28, 2019  (JP) .................. 2019-065023

(51) Int. Cl.
*H01L 27/12* (2006.01)
*G01N 23/20091* (2018.01)
*H01L 29/786* (2006.01)

(52) U.S. Cl.
CPC ... *H01L 29/7869* (2013.01); *G01N 23/20091* (2013.01); *H01L 27/1225* (2013.01); *H01J 2237/2442* (2013.01)

(58) Field of Classification Search
CPC ............ H01L 21/8234; H01L 21/8232; H01L 21/822; H01L 27/1225; H01L 27/12;
(Continued)

(56) References Cited

U.S. PATENT DOCUMENTS 8,912,537 B2* 12/2014 Wakana ............. H01L 29/7869
257/43
10,748,939 B2* 8/2020 Kitagawa ............... H01L 21/28
(Continued)

FOREIGN PATENT DOCUMENTS

JP  2017-41641 A  2/2017
JP  2018-78339 A  5/2018
(Continued)

OTHER PUBLICATIONS

Allen et al., "Chemical mapping at atomic resolution using energy-dispersive x-ray spectroscopy", 2012, MRS Bulletin, vol. 37, pp. 47-52 (Jan. 2012). (Year: 2012).*
(Continued)

*Primary Examiner* — Nikolay K Yushin
(74) *Attorney, Agent, or Firm* — XSENSUS LLP

(57) ABSTRACT

A semiconductor device includes an oxide semiconductor layer including indium, a gate electrode facing the oxide semiconductor layer, a gate insulating layer between the oxide semiconductor layer and the gate electrode, and a first electrode arranged above the oxide semiconductor layer and being in contact with the oxide semiconductor layer from above the oxide semiconductor layer. The indium is unevenly distributed in an unevenly distributed region among the oxide semiconductor layer. The unevenly distributed region overlaps with the first conductive layer in a planar view.

8 Claims, 33 Drawing Sheets

(58) Field of Classification Search
CPC .............. H01L 27/1251; H01L 27/088; H01L 29/7869; H01L 29/786; H01L 29/78618; H01L 29/458; G01N 23/20091; G01N 23/00; G01N 23/20; G01N 2223/07; G01N 2223/611; G01N 2223/60; G01N 2223/00; H01J 2237/2442

See application file for complete search history.

(56) References Cited

U.S. PATENT DOCUMENTS

| | | | |
|---|---|---|---|
| 2013/0099229 A1* | 4/2013 | Wakana | H01L 29/7869 257/43 |
| 2014/0151686 A1 | 6/2014 | Yamazaki et al. | |
| 2017/0323907 A1* | 11/2017 | Kitagawa | H01L 29/78693 |
| 2018/0076231 A1 | 3/2018 | Yamazaki et al. | |

FOREIGN PATENT DOCUMENTS

| | | |
|---|---|---|
| JP | 2018-190949 A | 11/2018 |
| WO | 2011/132769 A1 | 10/2011 |

OTHER PUBLICATIONS

International Search Report and Written Opinion mailed on Apr. 21, 2020, received for PCT Application PCT/JP2020/005321, Filed on Feb. 12, 2020, 9 pages including English Translation.

Office Action issued Sep. 6, 2022 in Japanese Patent Application No. 2019-065023, 5 pages. (Submitting English Translation only).

\* cited by examiner

US 12,094,980 B2

SEMICONDUCTOR DEVICE

CROSS-REFERENCE TO RELATED APPLICATIONS

This application is a U.S. continuation application filed under 35 U.S.C. § 111(a), of International Application No. PCT/JP2020/005321, filed on Feb. 12, 2020, which claims priority to Japanese Patent Application No. 2019-065023 filed on Mar. 28, 2019, the disclosures of which are incorporated by reference.

FIELD

An embodiment of the present invention is related to a semiconductor device and a display device. In particular, an embodiment of the present invention is related to a semiconductor device in which an oxide semiconductor is used as a channel and a display device including the semiconductor device.

BACKGROUND

In recent years, the development of a semiconductor device using an oxide semiconductor as a channel has been progressing (for example, Japanese Laid Open Patent Publication No. 2018-078339) in place of amorphous silicon, low-temperature polysilicon and single crystal silicon. The semiconductor device which uses an oxide semiconductor as a channel can be formed with a simple structure and at a low-temperature process similar to a semiconductor device which uses amorphous silicon as a channel. It is known that a semiconductor device which uses an oxide semiconductor as a channel has higher mobility than a semiconductor which device uses amorphous silicon as a channel. A semiconductor device which uses an oxide semiconductor as a channel is known to have a very low off current.

In order to stably operate for a semiconductor device which uses an oxide semiconductor, it is important to supply a large amount of oxygen to the oxide semiconductor in the manufacturing process and reduce oxygen vacancies which are formed in the oxide semiconductor. Japanese Laid Open Patent Application No. 2018-078339 discloses a technique for forming an insulating layer which covers an oxide semiconductor under a condition where the insulating layer contains a large amount of oxygen as one method for supplying oxygen to an oxide semiconductor.

However, an insulating layer formed under the condition where the insulating layer contains a large amount of oxygen will contain a lot of defects. This causes abnormal characteristics in the semiconductor device or a fluctuation in characteristics in a reliability test, which are thought to be aftereffects of electrons trapped in the defects. On the other hand, when an insulating layer with less defects is used, it is impossible to increase the oxygen contained in the insulating layer. Therefore, it is impossible to sufficiently provide oxygen from the insulating layer to the oxide semiconductor. Thus, it is required to achieve a semiconductor device structure and a manufacturing method thereof to improve reliability of the semiconductor device, even when the insulating layer which contains a large amount of oxygen is used as the insulating layer covering the oxide semiconductor.

SUMMARY

A semiconductor device according to an embodiment of the present disclosure includes an oxide semiconductor layer including indium, a gate electrode facing the oxide semiconductor layer, a gate insulating layer between the oxide semiconductor layer and the gate electrode, and a first electrode arranged above the oxide semiconductor layer and in contact with the oxide semiconductor layer from above the oxide semiconductor layer. The indium is unevenly distributed in an unevenly distributed region among the oxide semiconductor layer. The unevenly distributed region overlaps the first conductive layer in a planar view.

DESCRIPTION OF EMBODIMENTS

Figure 1:
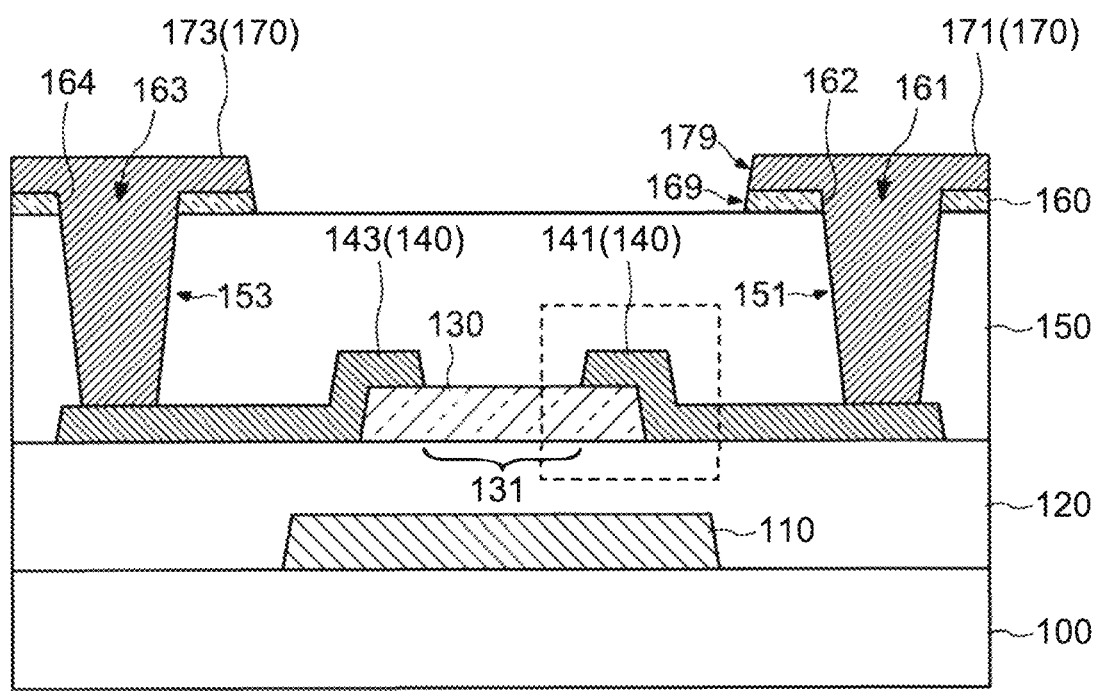
FIG. 1 is a cross-sectional view showing an outline of a semiconductor device according to an embodiment of the present invention.

Each embodiment of the present invention is explained below while referring to the drawings. However, the disclosure herein is only an example and a structure easily arrived at by a person skilled in the art by making appropriate modifications without departing from the concept of the invention is naturally to be contained in the scope of the present invention. The drawings may be schematically represented with respect to the width, thickness, shape and the like of each portion as compared with the actual form in order to clarify the explanation more clearly. However, they are only an example and do not limit an interpretation of the present invention. In the specification and drawings, elements having the same functions as those described with reference to preceding figures are attached with a letter of the alphabet after the same reference symbol and a detailed explanation may be omitted as appropriate.

In each embodiment of the present invention, a direction from a substrate towards an oxide semiconductor layer is referred to as "up" or "above". Conversely, a direction from the semiconductor layer towards the substrate is referred to as "down" or "below". As described above, for the convenience of explanation, although an explanation is made using the terms "upper" or "lower", for example, the vertical relationship between the substrate and the semiconductor layer may be reversed. In the explanation below, for example, the expression "semiconductor layer on the substrate" merely describes the vertical relationship between the substrate and the semiconductor layer as described above, and other members may also be arranged between the substrate and the semiconductor layer. Upper or lower means the stacking order in a structure in which a plurality of layers is stacked, and in the case when a pixel electrode is expressed as above a transistor, it may be a positional relationship in which the transistor and the pixel electrode do not overlap in a planar view. On the other hand, when a pixel electrode is expressed vertically above a transistor, it means a positional relationship in which the transistor and the pixel electrode overlap in a planar view.

"Display device" refers to a structure that displays an image using an electro-optical layer. For example, the term "display device" may refer to a display panel including an electro-optical layer, or a structure in which another optical member (for example, a polarizing member, a backlight, a touch panel, or the like) is attached to a display cell. The "electro-optical layer" may include a liquid crystal layer, an electroluminescence (EL) layer, an electrochromic (EC) layer, and an electrophoretic layer as long as no technical contradiction occurs. Therefore, the embodiments described later will be described by exemplifying a liquid crystal display device including a liquid crystal layer and an organic EL display device including an organic EL layer as a display device. The present invention can be applied to a display device including the electro-optical layer mentioned above.

In the present specification, the expressions "a includes A, B or C", "a includes any of A, B and C", and "a includes one selected from the group consisting of A, B and C" unless otherwise stated does not exclude the case where a includes a plurality of combinations of A to C. Furthermore, these expressions do not exclude the case where a includes other elements.

Each of the following embodiments can be combined with each other as long as no technical contradiction occurs.

One of the subjects in an embodiment of the present invention is to achieve a highly reliable semiconductor device.

First Embodiment

A semiconductor device and a manufacturing method of the semiconductor device according to an embodiment of the present invention is explained using FIG. 1 to FIG. 7. The semiconductor device of the embodiments shown herein may also be used in an integrated circuit (IC) such as a micro-processing unit (MPU) or a memory circuit in addition to a transistor used in a display device.

[Structure of Semiconductor Device 10]

Figure 2:
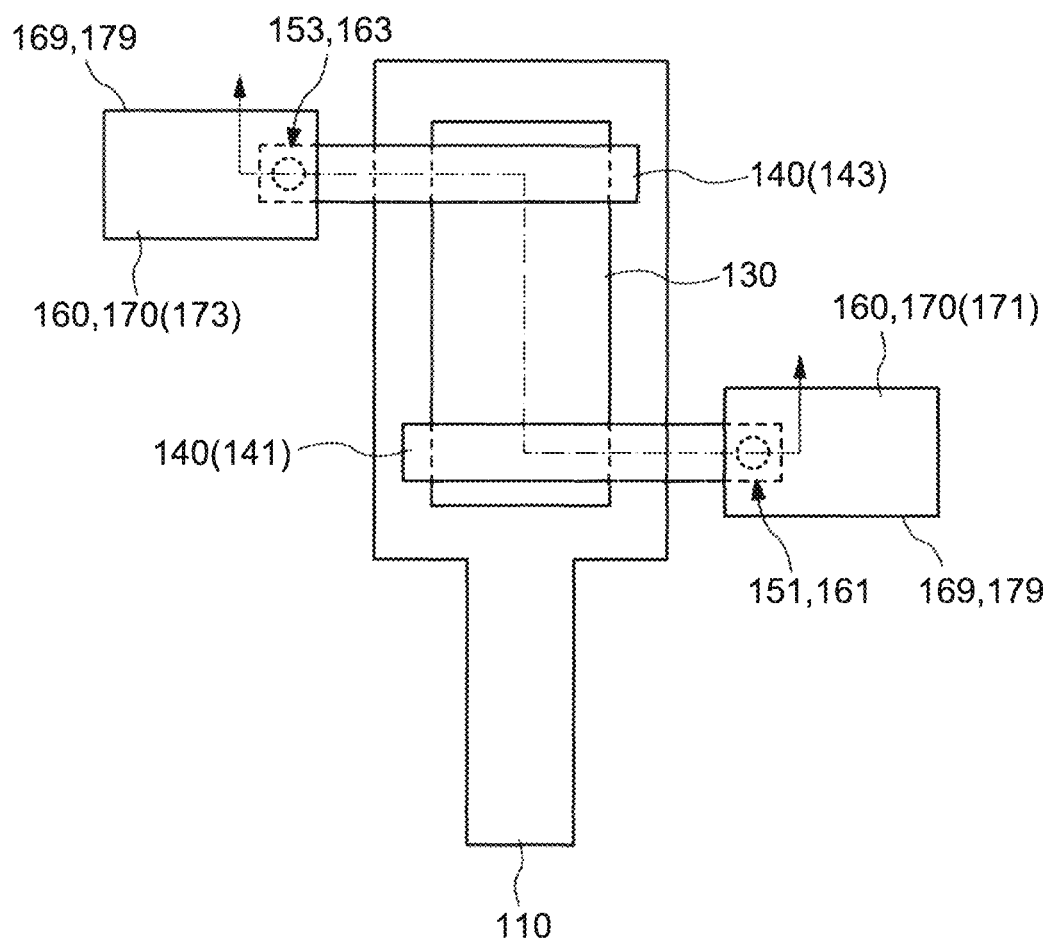
FIG. 2 is a plan view showing an outline of a semiconductor device according to an embodiment of the present invention.
Figure 3:
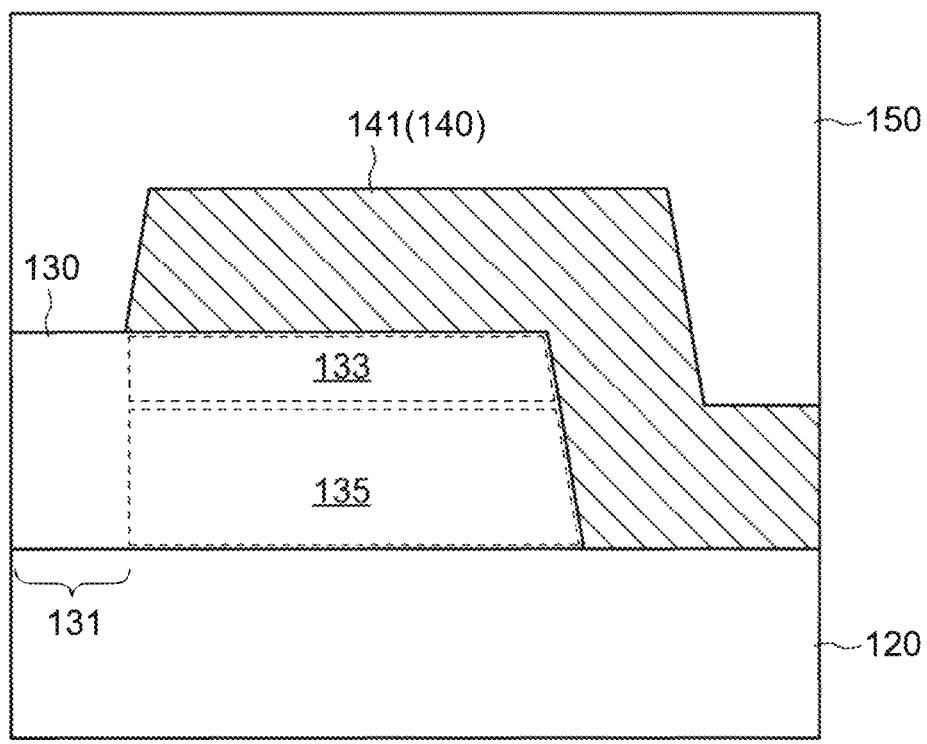
FIG. 3 is an enlarged cross-sectional view of a part of a semiconductor device according to an embodiment of the present invention.

The structure of a semiconductor device 10 according to an embodiment of the present invention is explained using FIG. 1 to FIG. 3. FIG. 1 is a cross-sectional view showing an outline of a semiconductor device according to an embodiment of the present invention. FIG. 2 is a planar view showing an outline of the semiconductor device according to an embodiment of the present invention. FIG. 3 is a partially enlarged cross-sectional view of the semiconductor device according to an embodiment of the present invention.

As is shown in FIG. 1, the semiconductor device 10 is arranged above a substrate 100. The semiconductor device 10 includes a first gate electrode 110, a first gate insulating layer 120, a first oxide semiconductor layer 130, a first source electrode 141, a first drain electrode 143, a first insulating layer 150, an oxide layer 160, a first source wiring 171, and a first drain wiring 173. In a case where the first source electrode 141 and the first drain electrode 143 are not particularly distinguished, these electrodes may be referred to as a first electrode 140. In a case where the first source wiring 171 and the first drain wiring 173 are not particularly distinguished, these wirings may be referred to as a first conductive layer 170.

The first gate electrode 110 is arranged on the substrate 100. The first gate electrode 110 faces the first oxide semiconductor layer 130. The first gate insulating layer 120 is arranged between the first gate electrode 110 and the first oxide semiconductor layer 130. The first electrode 140 is arranged on the first gate insulating layer 120 and above the first oxide semiconductor layer 130. The first electrode 140 extends from the upper surface of the first gate insulating layer 120 to a pattern end of the first oxide semiconductor layer 130 and continues to the upper surface of the first oxide semiconductor layer 130. That is, the first electrode 140 is in contact with the first oxide semiconductor layer 130 from above the first oxide semiconductor layer 130.

As will be described in detail later, the first oxide semiconductor layer 130 is an indium-containing oxide semiconductor. The first oxide semiconductor layer 130 includes a channel region 131 between the first source electrode 141 and the first drain electrode 143. That is, each of the first source electrode 141 and the first drain electrode 143 is in contact with the first oxide semiconductor layer 130 at an end portion of the channel region 131. In the first oxide semiconductor layer 130 below the first source electrode 141 and the first drain electrode 143, indium contained in the first oxide semiconductor layer 130 is unevenly distributed. In other words, in the first oxide semiconductor layer 130 in a region overlapping the first electrode 140 in a planar view, indium contained in the first oxide semiconductor layer 130 is unevenly distributed.

Inventors have found that the reliability of the semiconductor device 10 is improved by segregating indium contained in the first oxide semiconductor layer 130 below the first electrode 140 (in the region overlapping the first electrode 140 in a planar view) of the first oxide semiconductor layer 130 and forming the first oxide semiconductor layer 130 in a state where the indium is unevenly distributed.

The first insulating layer 150 covers the first oxide semiconductor layer 130 and the first electrode 140. A first aperture 151 and a first aperture 153 are provided in the first insulating layer 150. The first aperture 151 is an opening that reaches the first source electrode 141. The first aperture 153 is an opening that reaches the first drain electrode 143. The oxide layer 160 is provided on the first insulating layer 150. Second apertures 161 and 163 are provided in the oxide layer 160. The second aperture 161 is an aperture continuous with the first aperture 151. The second aperture 163 is an aperture continuous with the first aperture 153.

The first conductive layer 170 is provided on the oxide 160 and inside the first apertures 151, 153. In a planar view, the first conductive layer 170 is provided in the same region as the oxide layer 160, except for the first apertures 151, 153. That is, the oxide layer 160 is not provided in a region where the first conductive layer 170 is not provided in a planar view, and the first insulating layer 150 is exposed from the oxide layer 160. The first conductive layer 170 is in contact with the first electrode 140 at the bottom of the first apertures 151, 153, and electrically connected to the first oxide semiconductor layer 130 via the first electrode 140.

As is shown in FIG. 2, the first oxide semiconductor layer 130 is arranged inside the first gate electrode 110 in a planar view. In particular, the first oxide semiconductor layer 130 is arranged inside the first gate electrode 110 in a region where the channel of the semiconductor device 10 is formed. In other words, the outer edge of the pattern of the first oxide semiconductor layer 130 is surrounded by the outer edge of the pattern of the first gate electrode 110 in a planar view. The first electrode 140 crosses the first oxide semiconductor layer 130 in a planar view. In other words, the first electrode 140 intersects the first oxide semiconductor layer 130. The second aperture 161 overlaps the first aperture 151 in a planar view. The second aperture 163 overlaps the first aperture 153 in a planar view. Indium contained in the first oxide semiconductor layer 130 is unevenly distributed in the first oxide semiconductor layer 130 in the region overlapping the first electrode 140 in a planar view. The structure described above is merely an embodiment, and the present invention is not limited to the structure described above.

FIG. 3 is an enlarged view of a region surrounded by a dotted frame in FIG. 1. As shown in FIG. 3, the first oxide semiconductor layer 130 is provided with the channel region 131, a first region 133, and a second region 135. The channel region 131 is a region in which the first electrode 140 is not provided above the first oxide semiconductor layer 130. The first region 133 and the second region 135 are regions in which the first electrode 140 is provided above the first oxide semiconductor layer 130. In other words, the channel region 131 is a region in which the first oxide semiconductor layer 130 is exposed from the first electrode 140 in planar view. The first region 133 and the second region 135 are regions in which the first oxide semiconductor layer 130 overlaps the first electrode 140 in planar view.

The channel region 131, the first region 133, and the second region 135 are formed from one oxide semiconductor layer, respectively. These regions have the same composition and the same crystalline state immediately after film formation. However, the compositions and crystalline states of the first oxide semiconductor layer 130 in each region differ depending on the effect of the manufacturing process of the semiconductor device 10.

In the first oxide semiconductor layer 130 in the first region 133 and the second region 135, indium contained in the first oxide semiconductor layer 130 is unevenly distributed. On the other hand, in the first oxide semiconductor layer 130 in the channel region 131, indium is not unevenly distributed. The presence or absence of unevenly distributed indium in the first oxide semiconductor layer 130 may vary depending on the method of measurement and the accuracy of the measurement. If it is determined that indium is unevenly distributed in the first oxide semiconductor layer 130 in the channel region 131, the degree (or amount) of uneven distribution of indium in the first oxide semiconductor layer 130 in the channel region 131 is larger than the degree (or amount) of uneven distribution of indium in the first oxide semiconductor layer 130 in the first region 133 and the second region 135. Further, the degree of uneven distribution of indium in the first oxide semiconductor layer 130 in the second region 135 is larger than the degree of uneven distribution of indium in the first oxide semiconductor layer 130 in the first region 133.

Here, a large degree of uneven distribution of indium means that a size of the region where indium is unevenly distributed is relatively large, a size of the region (high density region) where indium density is higher than other regions is relatively large, or a size (or crystalline particle size) of crystallized indium is relatively large.

The degree of uneven distribution of indium can be determined by, for example, a cross-sectional TEM (Transmission Electron Microscope) image, a cross-sectional STEM (Scanning Transmission Electron Microscope) image, or a cross-sectional SEM (Scanning Electron Microscope) image. For example, in the case where a contrast of the first oxide semiconductor layer 130 in the channel region 131 is larger than a contrast of the first oxide semiconductor layer 130 in the first region 133 and the second region 135, it can be determined that the degree of uneven distribution of indium in the first region 133 and the second region 135 is larger than the degree of uneven distribution of indium in the channel region 131.

Alternatively, in a case where a size of a mass of a "bright" portion or "dark" portion in the contrast in the cross-sectional image mentioned above is relatively large, it can be determined that the degree of uneven distribution of indium is large. Alternatively, for example, in mapping analysis (plane analysis) of EDX (Energy Dispersive X-ray spectrometry) using SEM or STEM, in the case where a signal strength due to indium is larger than other regions, that is, in the case where a region with dense indium is relatively larger than other regions, it can be determined that the degree of uneven distribution of indium is large.

[Uneven Distribution of Indium in the First Oxide Semiconductor Layer 130]

The uneven distribution of indium in the channel region 131, the first region 133, and the second region 135 of the first oxide semiconductor layer 130 will be described with reference to FIGS. 4 to 7.

Figure 4:
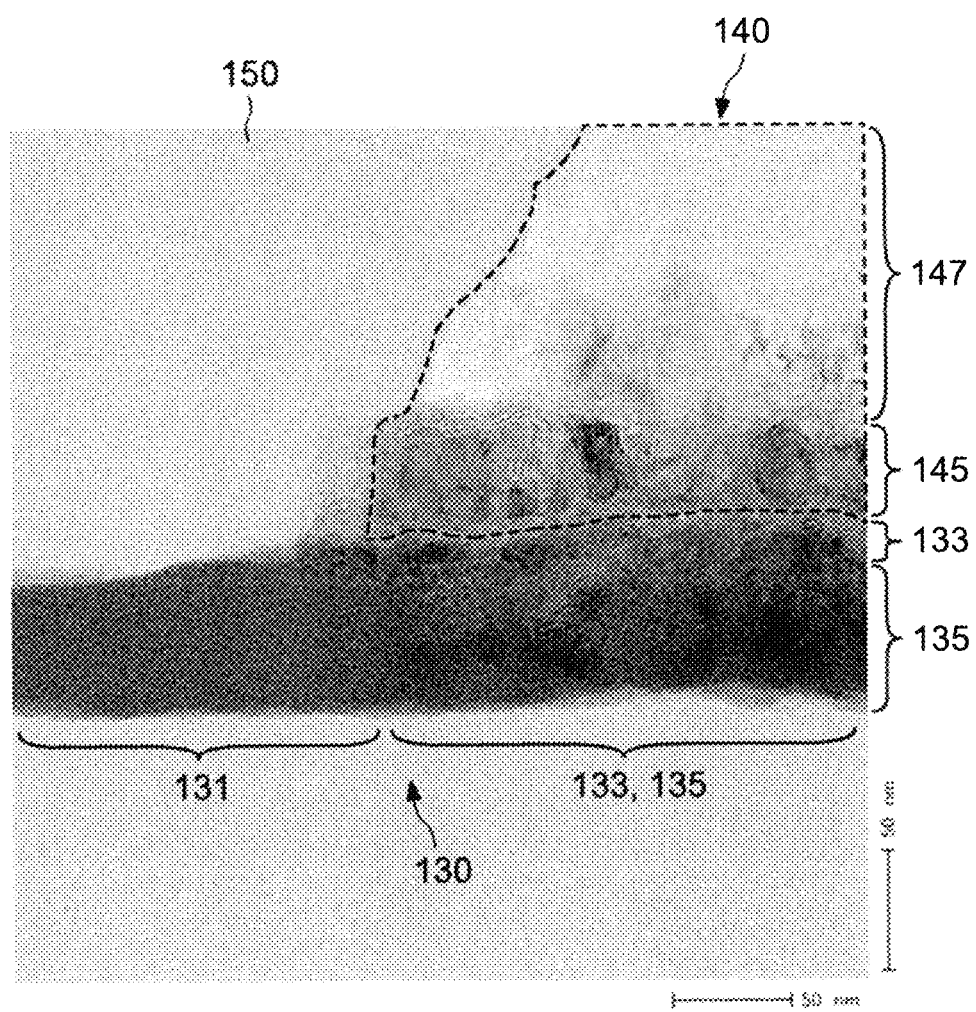
FIG. 4 is a cross-sectional TEM image of a semiconductor device according to an embodiment of the present invention.

FIG. 4 is a cross-sectional TEM image of a semiconductor device according to an embodiment of the present invention. In FIG. 4, a structure in which titanium (Ti) and aluminum (Al) are stacked from below is used as the first electrode 140. A titanium layer 145 and an aluminum layer 147 have different patterns in a cross-sectional view due to the respective different crystalline states. An oxide semiconductor (IGZO) containing indium (In), gallium (Ga), zinc (Zn), and oxygen (O) is used as the first oxide semiconductor layer 130. Of the first oxide semiconductor layer 130, a region where the first electrode 140 is not provided above the first oxide semiconductor layer 130 is the channel region 131, and a region where the first electrode 140 is provided above the first oxide semiconductor layer 130 corresponds to the first region 133 and the second region 135. In FIG. 4, heavier elements are displayed darker.

As shown in FIG. 4, with respect to the contrast of the cross-sectional image, the size of the mass of the "dark" portion of the first oxide semiconductor layer 130 in the first region 133 and the second region 135 is larger than the size of the mass of the "dark" portion of the first oxide semiconductor layer 130 in the channel region 131. In FIG. 4, since the "bright" portion and the "dark" portion are substantially uniformly present in the first oxide semiconductor layer 130 of the channel region 131, it is determined that indium is not unevenly distributed. On the other hand, in the first oxide semiconductor layers 130 in the first region 133 and the second region 135, since the "dark" portion is localized, it is determined that indium is unevenly distributed. In the following description, the expressions "bright" portion and "dark" portion refer to light and darkness in the contrast of the cross-sectional image.

The size of the mass of the "dark" portion of the first oxide semiconductor layer 130 in the second region 135 is larger than the size of the mass of the "dark" portion of the first oxide semiconductor layer 130 in the first region 133. That is, the degree of uneven distribution of indium in the first oxide semiconductor layer 130 is larger in the first region 133 and the second region 135 than in the channel region 131. The degree of uneven distribution of indium in the first oxide semiconductor layer 130 is larger in the second region 135 than in the first region 133. Since it is considered that the uneven distribution of indium is caused by the crystallization of indium, it can be said that the crystalline particle size of indium unevenly distributed in the first oxide semiconductor layer 130 is larger in the second region 135 than in the first region 133. A mixed crystal region in which titanium and aluminum react is formed between the titanium layer 145 and the aluminum layer 147.

Figure 5A:
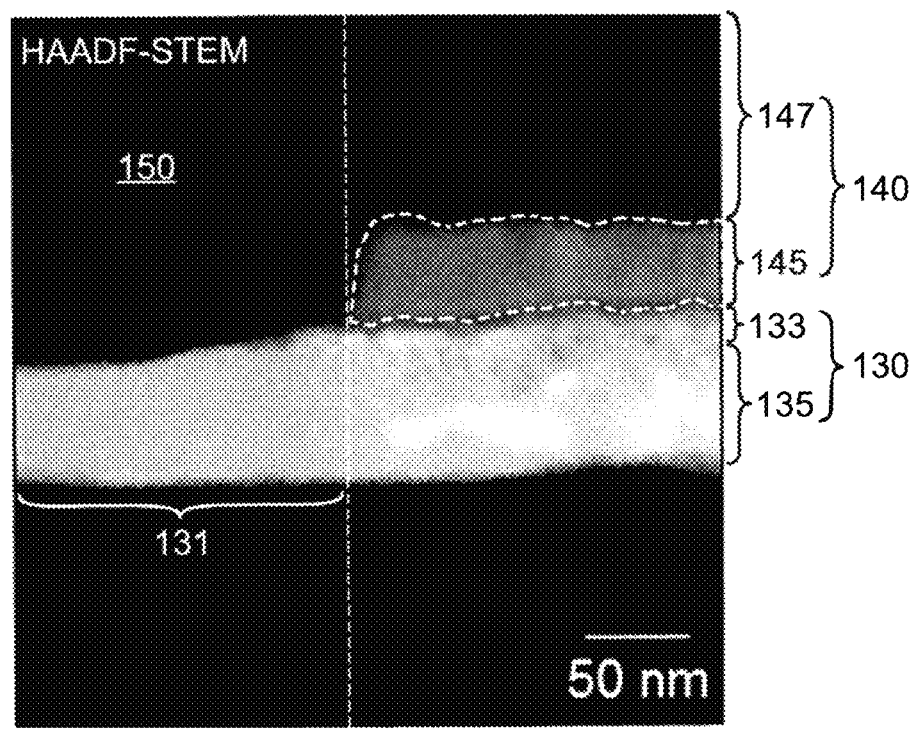
FIG. 5A is a cross-sectional STEM image of a semiconductor device according to an embodiment of the present invention.
Figure 5B:
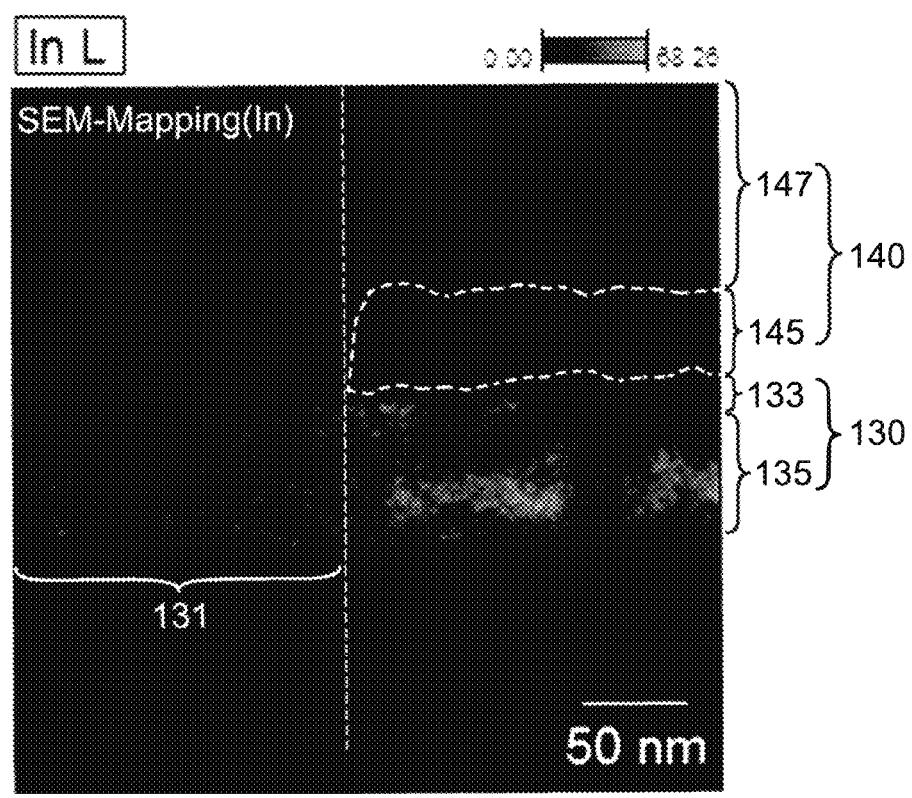
FIG. 5B is an EDX mapping measurement result of a semiconductor device according to an embodiment of the present invention.

FIG. 5A is a cross-sectional STEM image of a semiconductor device according to an embodiment of the present invention. FIG. 5B shows an EDX mapping measurement result of a semiconductor device according to an embodiment of the present invention. The sample of the cross-sectional STEM image and the EDX mapping measurement shown in FIGS. 5A and 5B is the same as the sample of the cross-sectional TEM image shown in FIG. 4. The STEM image shown in FIG. 5A is a HAADF (High-Angle Annular Dark Field)-STEM image. That is, heavy elements are displayed brightly in FIG. 5A. The STEM image shown in FIG. 5A and an EDX mapping image shown in FIG. 5B were obtained by measuring the same portion of the same sample.

A dotted line extending vertically to a position corresponding to the end portion of the first electrode 140 (end portion at the lower left of the titanium layer 145 of the first electrode 140 in FIG. 5A and FIG. 5B) is shown in each of the STEM image of FIG. 5A and the EDX mapping image of FIG. 5B. In the EDX mapping image, a region corresponding to the titanium layer 145 is surrounded by the dotted line.

As shown in the STEM image of FIG. 5A and the EDX mapping image of FIG. 5B, the channel region 131 of the first oxide semiconductor layer 130 is a region with high uniformity of indium compared to other regions. In other words, the channel region 131 of the first oxide semiconductor layer 130 is a region that is smaller in size of the mass of the "bright" portion than other regions. That is, the channel region 131 is a region without uneven distribution of indium in the first oxide semiconductor layer 130.

On the other hand, the first region 133 and the second region 135 are both regions in which indium is unevenly distributed in the first oxide semiconductor layer 130. Comparing the first region 133 and the second region 135, the size of the mass of the "bright" portion in the second region 135 is larger than the size of the mass of the "bright" portion in the first region 133.

As shown in the EDX mapping image of FIG. 5B, the signal strength of indium in the EDX analysis is higher in the "bright" portion confirmed in the STEM image of FIG. 5A than in the other portions. In other words, indium is densely packed in the "bright" portion of the STEM image. In the following explanation, the region in which the mass of the "bright" portion is present is a region in which indium is densely packed and therefore is referred to as an "indium dense region", and the region in which the mass of the "dark" portion is present is a region in which indium is deficient and therefore is referred to as an "indium deficient region". The region in which indium is unevenly distributed is a region including the indium dense region and the indium deficient region.

As described above, the degree of uneven distribution of indium in the first oxide semiconductor layer 130 is greater in the second region 135 than in the first region 133. As described above, since the uneven distribution of indium is considered to be caused by the crystallization of indium, it can be said that the crystalline particle size of indium unevenly distributed in the first oxide semiconductor layer 130 is larger in the second region 135 than in the first region 133.

Figure 6A:
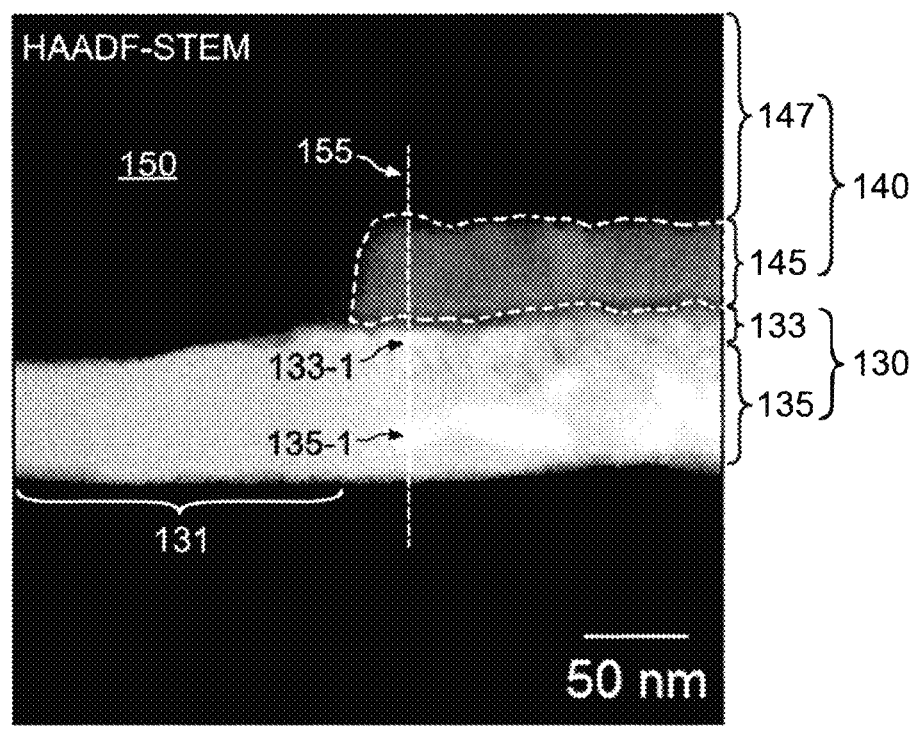
FIG. 6A is a cross-sectional STEM image of a semiconductor device according to an embodiment of the present invention.
Figure 6B:
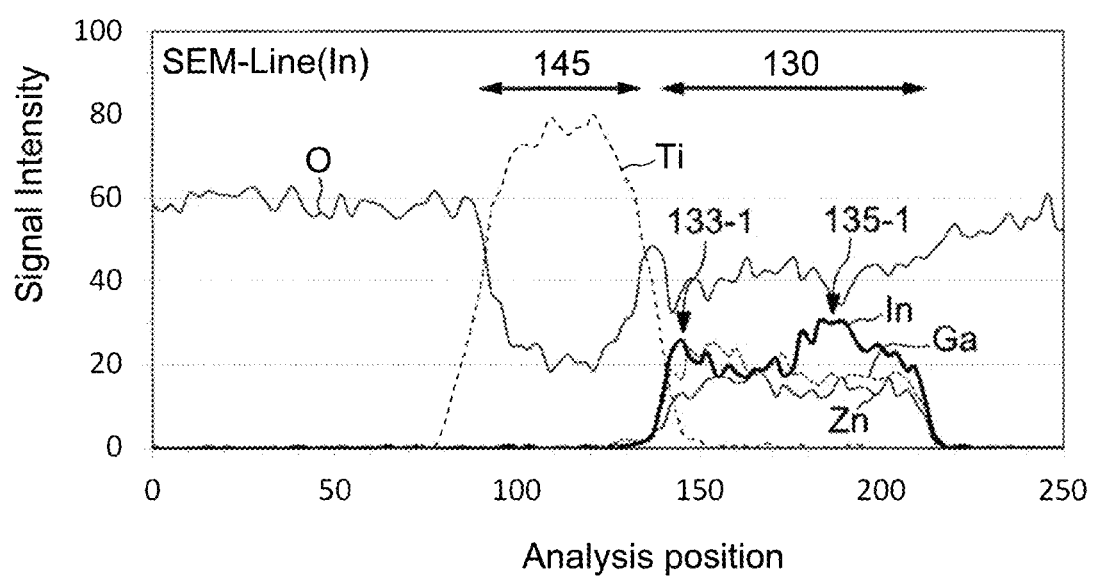
FIG. 6B is an EDX line analysis result of a semiconductor device according to an embodiment of the present invention.
Figure 7A:
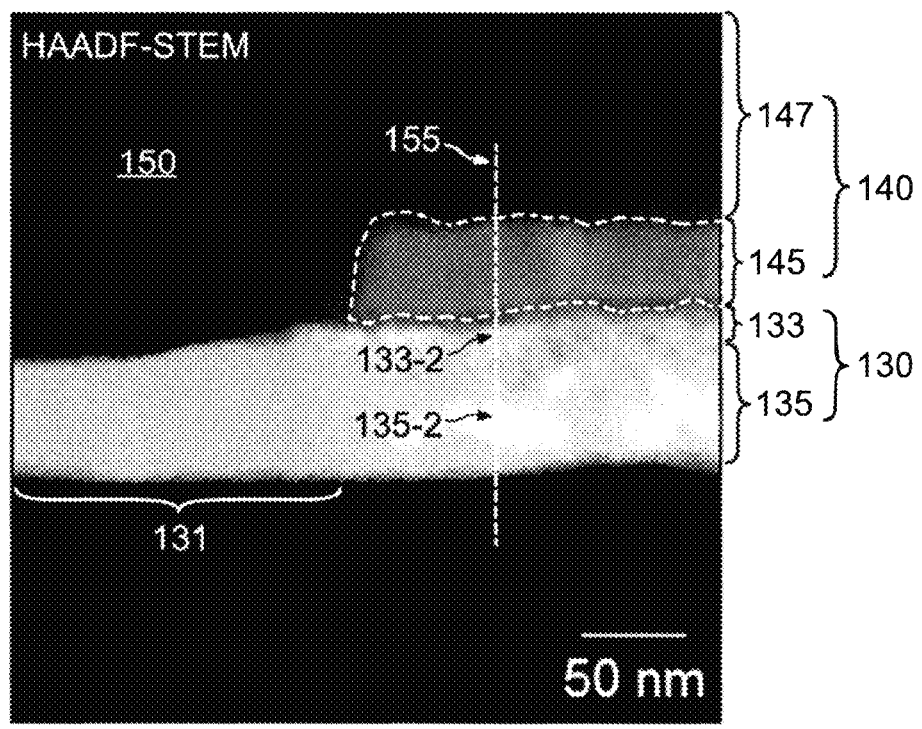
FIG. 7A is a cross-sectional STEM image of a semiconductor device according to an embodiment of the present invention.
Figure 7B:
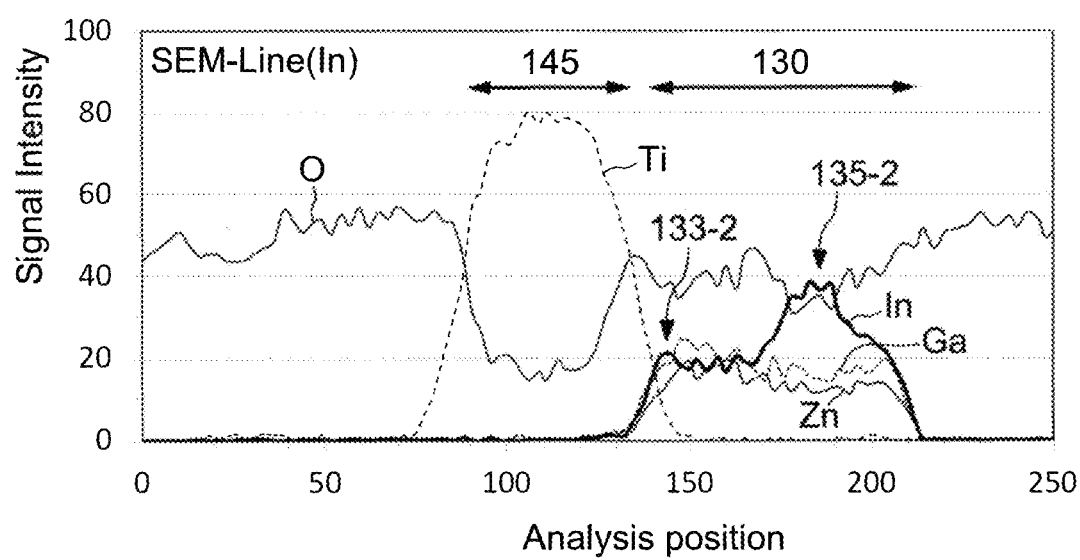
FIG. 7B is an EDX line analysis result of a semiconductor device according to an embodiment of the present invention.

FIG. 6A, FIG. 6B, FIG. 7A, and FIG. 7B are cross-sectional STEM images of a semiconductor device according to an embodiment of the present invention and EDX line analysis results obtained by measuring a part of the cross-sectional STEM images. The sample of the cross-sectional STEM images shown in FIGS. 6A and 7A is the same as the sample of the cross-sectional STEM image shown in FIG. 5A. In the STEM images of FIG. 6A and FIG. 7A, a region where the EDX line analysis has been performed is indicated by a dotted line 155. In the EDX line analysis results of FIG. 6B and FIG. 7B, the horizontal axis indicates the analysis position in the line analysis, and the vertical axis indicates the signal strength of each element. The EDX line analysis results show spectrums of indium (In), gallium (Ga), zinc (Zn), oxygen (O), and titanium (Ti). The area corresponding to the first oxide semiconductor layer 130 and the first electrode 140, respectively, are shown in the horizontal axis of the graph of the EDX line analysis results.

In the STEM images of FIG. 6A and FIG. 7A, indium dense regions 133-1, 135-1 (see FIG. 6A), 133-2, and 135-2 (see FIG. 7A) exist in the first region 133 and the second region 135, respectively. As shown in the EDX line analysis results of FIG. 6B and FIG. 7B, peaks are confirmed in an In spectrum in the indium dense regions. When particular attention is paid to the spectrum of the indium dense regions 135-1 and 135-2, the signal strengths of Ga, Zn, and O decrease in the region where the In peak exists. In other words, in the indium dense regions 135-1 and 135-2, it is considered that In is dense or crystallized, and a composition that is different from the IGZO is locally formed.

[Method for Forming an Uneven Distribution Region of Indium in the First Oxide Semiconductor Layer 130]

Various methods can be used to form an uneven distribution region of indium in the first oxide semiconductor layer 130, and an example of such methods is described below. For example, it is possible to form the uneven distribution region of indium in the first oxide semiconductor layer 130 below the first electrode 140 by heating the first oxide semiconductor layer 130 below the first electrode 140 in a state where the first insulating layer 150 is formed on the first electrode 140.

For example, a method of irradiating a laser beam from above to the first electrode 140 is used as a method of locally heating the first oxide semiconductor layer 130 below the first electrode 140. As the wavelength of the laser beam, it is possible to select a wavelength having a high absorption rate of the laser beam for the first electrode 140 as compared with the absorption rate of the laser beam for the first oxide semiconductor layer 130. By irradiating the laser from above the first electrode 140 using the laser beam having such a wavelength, the first electrode 140 can be selectively heated. Thus, the first oxide semiconductor layer 130 below the first electrode 140 can be selectively heated at a high temperature.

By selectively heating the first oxide semiconductor layer 130 below the first electrode 140 as described above, a chemical reaction proceeds between the first oxide semiconductor layer 130 and the first electrode 140 of that region. By this chemical reaction, indium oxide in the first oxide semiconductor layer 130 is reduced, isolated indiums by the reduction bond to each other, and crystallization of indium proceeds. As a result, an uneven distribution region of indium is formed.

[Conventional Semiconductor Device using Oxide Semiconductor as Channels]

Figure 8:
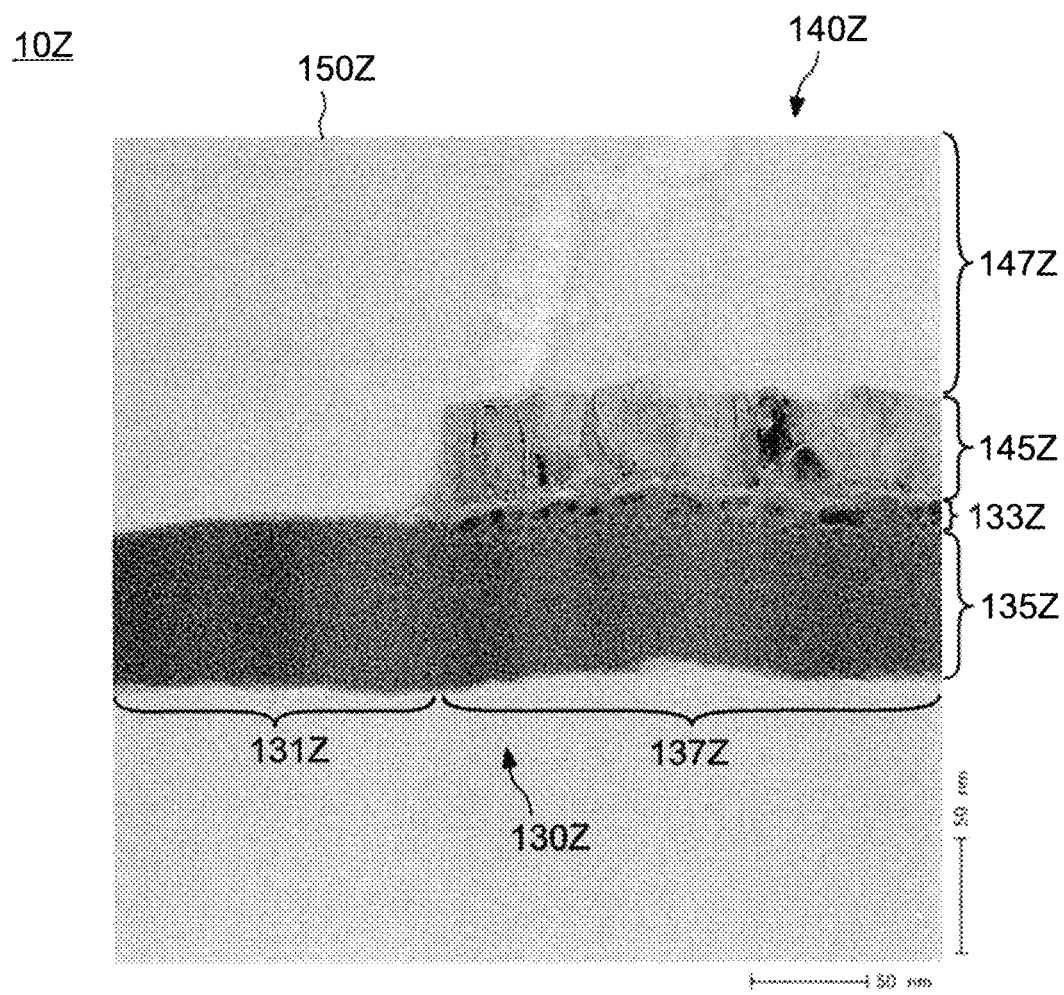
FIG. 8 is a cross-sectional TEM image of a conventional semiconductor device.
Figure 9A:
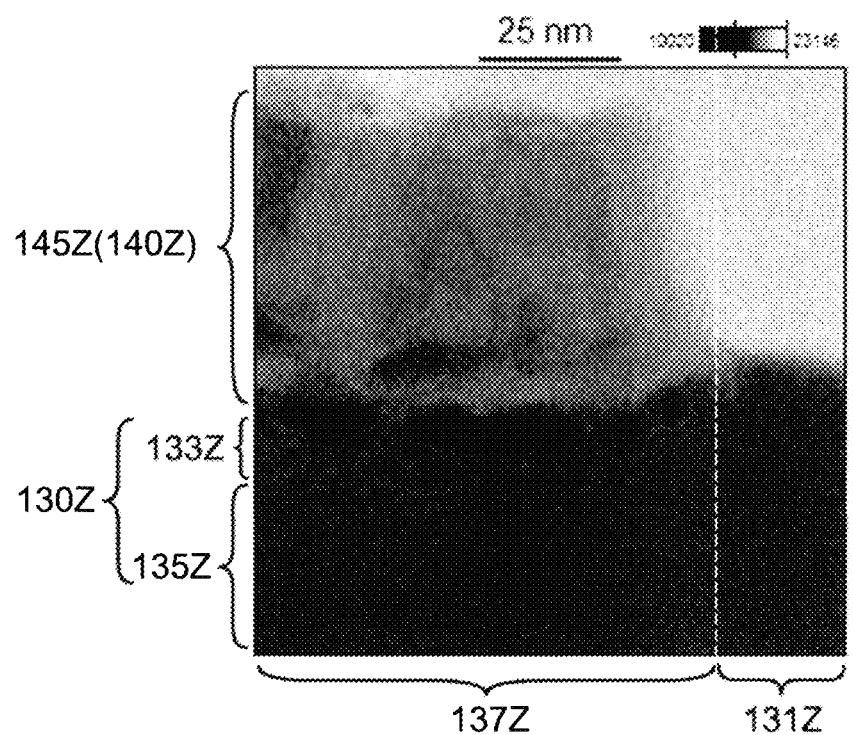
FIG. 9A is a cross-sectional STEM image of a conventional semiconductor device.
Figure 9B:
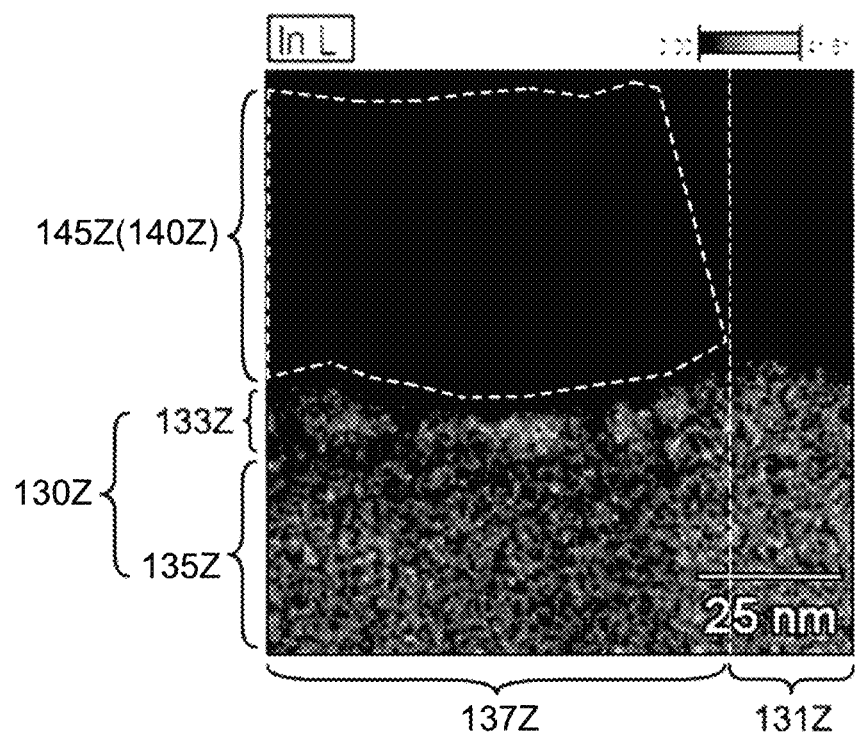
FIG. 9B is an EDX mapping measurement result of a conventional semiconductor device.

Regarding the conventional semiconductor device in which the oxide semiconductor is used as the channel, a result of evaluating the presence or absence of unevenly distributed indium in the oxide semiconductor layer will be described with reference to FIG. 8, FIG. 9A, and FIG. 9B. FIG. 8 is a cross-sectional TEM image of the conventional semiconductor device. FIG. 9A and FIG. 9B are cross-sectional STEM images of the conventional semiconductor device and a corresponding EDX mapping measurement result. A semiconductor device 10Z shown in FIG. 8 is the same as the semiconductor device 10 shown in FIG. 4 except that there is no uneven distribution of indium in a first oxide semiconductor layer 130Z as shown below. That is, a film formation condition of each layer constituting the semiconductor device 10Z is the same as a film formation condition of each layer constituting the semiconductor device 10.

FIG. 8 is a cross-sectional TEM image corresponding to FIG. 4. The structure of a first electrode 140Z shown in FIG. 8 is a structure in which a titanium layer 145Z and an aluminum layer 147Z are stacked from below, similar to FIG. 4. Unlike FIG. 4, the mixed crystal region in which titanium and aluminum react is not formed between the titanium layer 145Z and the aluminum layer 147Z. The IGZO is used as the first oxide semiconductor layered 130Z. In FIG. 8, of the first oxide semiconductor layer 130Z, a region on which the first electrode 140Z is not provided is a channel region 131Z, a region on which the first electrode 140Z is provided is a fourth region 137Z. The fourth region 137Z is a region corresponding to the first region 133 and the second region 135 in FIG. 4.

As shown in FIG. 8, regarding the brightness and darkness in the contrast of the cross-sectional image, in the first oxide semiconductor layer 130Z in the channel region 131Z and the fourth region 137Z, the "bright" portion and the "dark" portion are substantially uniformly present.

The sample of the cross-sectional STEM image shown in FIG. 9A is not exactly the same as the sample of the cross-sectional TEM image shown in FIG. 8, but the cross-sectional structures of the respective samples are the same. A dotted line extending vertically to a position corresponding to the end portion of the first electrode 140Z (end portion at the lower right of the titanium layer 145Z of the first electrode 140Z in each of FIG. 9A and FIG. 9B) is shown in each of the STEM image shown in FIG. 9A and the EDX mapping image shown in FIG. 9B. In the EDX mapping image, a region corresponding to the titanium layer 145Z is surrounded by a dotted line. As shown in FIG. 9A and FIG. 9B, the uneven distribution of indium is not confirmed in the first oxide semiconductor layer 130Z in the channel region 131Z and the fourth region 137Z.

[Reliability Comparison between the Semiconductor Device 10 of the First Embodiment and the Conventional Semiconductor Device 10Z]

Figure 10A:
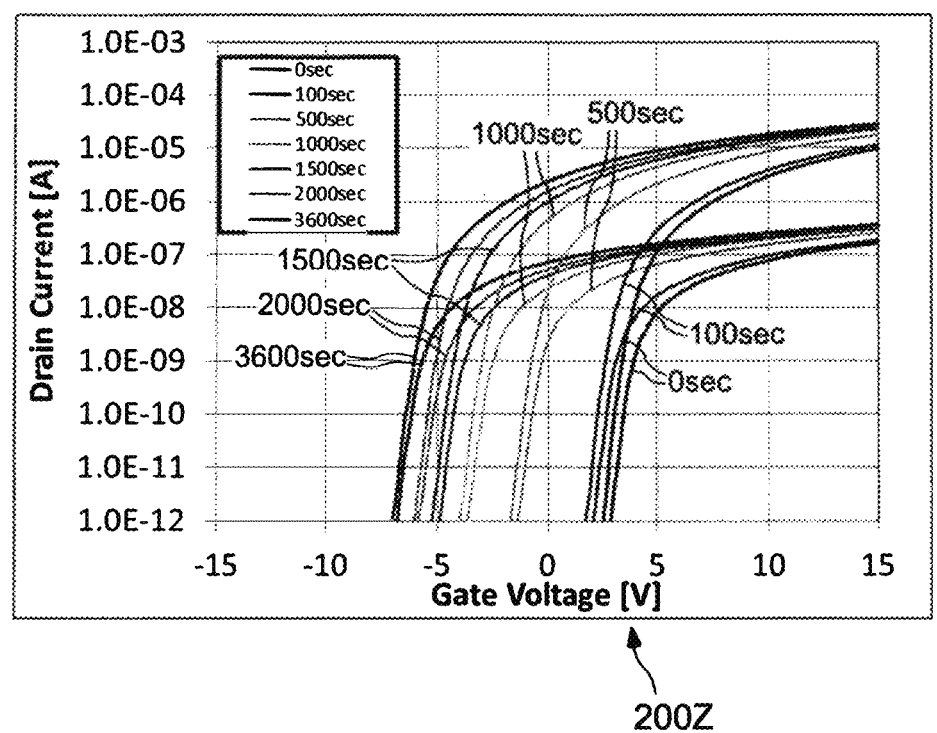
FIG. 10A is a diagram showing a reliability test result of a conventional semiconductor device.
Figure 10B:
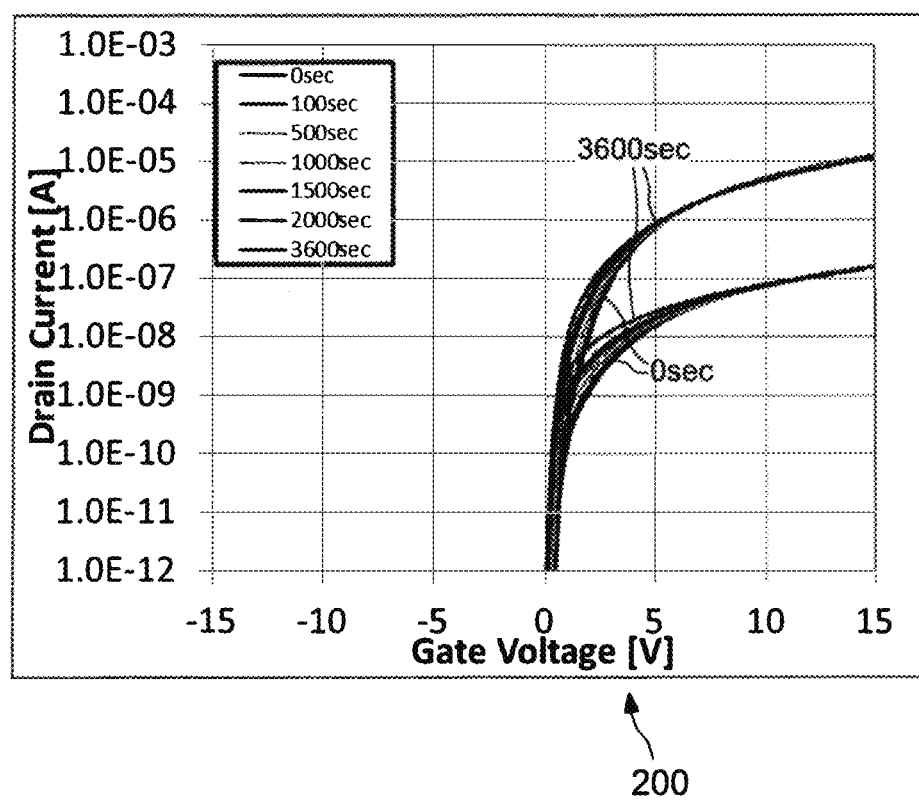
FIG. 10B is a diagram showing a reliability test result of a semiconductor device according to an embodiment of the present invention.

FIG. 10A is a diagram showing a reliability test result of the conventional semiconductor device. FIG. 10B is a diagram showing a reliability test result of a semiconductor device according to an embodiment of the present invention. A test result 200 shown in FIG. 10B is the result of the reliability test performed on the semiconductor device 10 of the first embodiment, and a test result 200Z shown in FIG. 10A is the result of the reliability test performed on the conventional semiconductor device 10Z. The [channel lengths/channel widths] of the semiconductor device used in the tests are [3.5 µm/4.0 µm].

The reliability tests in FIGS. 10A and 10B are NBTIS (Negative Bias Thermal Illumination Stress) tests to evaluate stress reliability. The condition of the reliability test is as follows.

Light irradiation condition: White LED 8,000 nits
Gate voltage: −30V
Source and drain voltages: 0V
Stage temperature when stress is applied: 60° C.

In FIG. 10A and FIG. 10B, the results of evaluating the electrical characteristics of each semiconductor device before applying stress (0 sec) and after the elapse of each stress application period (100 sec to 3600 sec) have been superimposed and displayed. The measurement condition of electrical characteristics of the semiconductor device before and after stress application are measured as follows.

Source-drain voltage: 0.1V, 10V
Gate scan voltage: −15V to 15V
Measurement environment: Dark room
Stage temperature at measurement: 60° C. (or "R.T. (room temperature)")

As shown in FIG. 10A and FIG. 10B, the threshold values of both the semiconductor device 10 of the first embodiment and the conventional semiconductor device 10Z are negatively shifted with increasing stress application periods. However, in the semiconductor device 10Z, the negative shift amount of the threshold is about 10V by applying stress for 3600 seconds (see FIG. 10A), whereas, in the semiconductor device 10, the negative shift amount of the threshold is about 2V even when stress is applied for the same amount of time (see FIG. 10B).

Structural differences between the semiconductor device 10 of the first embodiment and the conventional semiconductor device 10Z are as follows. In the semiconductor device 10, in the first oxide semiconductor layer 130 of the region overlapping the first electrode 140 in a planar view, the indium contained in the first oxide semiconductor layer 130 is unevenly distributed. On the other hand, in the semiconductor device 10Z, there is no uneven distribution of indium in the first oxide semiconductor layer 130Z. Therefore, it has been found that the reliability at least in the above NBTIS test can be improved by unevenly distributing indium in the first oxide semiconductor layer 130 of the region (the first region 133 and the second region 135) overlapping the first electrode 140 in a planar view as in the semiconductor device 10. Since the uneven distribution of indium in the first oxide semiconductor layer 130 of the channel region 131 adversely affects the characteristics of the semiconductor device 10, the uneven distribution region of indium is preferably formed only in the first region 133 and the second region 135.

[Material of Each Member of Semiconductor Device 10]

A substrate including a resin such as a polyimide substrate, an acrylic substrate, a siloxane substrate or a fluororesin substrate can be used as the substrate 100. That is, it is possible to use a flexible substrate having flexibility as the substrate 100. Impurities may also be introduced into the resin described above in order to improve heat resistance of the substrate 100. In particular, in the case where the semiconductor device 10 is a top emission type display, it is not necessary that the substrate 100 be transparent. Therefore, it is possible to use impurities which do not deteriorate the transparency of the substrate 100. On the other hand, in the case where the substrate 100 does not need flexibility, a rigid substrate which has translucency but does not have flexibility such as a glass substrate, a quartz substrate and a sapphire substrate can be used as the substrate 100. In the case where the semiconductor device 10 is used for an integrated circuit that is not a display device, a non-transmissive substrate such as a semiconductor substrate such as a silicon substrate, a silicon carbide substrate, and a compound semiconductor substrate, or a conductive substrate such as a stainless steel substrate, can be used as the substrate 100.

It is possible to use a general metal material as the first gate electrode 110, the first electrode 140, and the first conductive layer 170. For example, it is possible to use aluminum (Al), titanium (Ti), chromium (Cr), cobalt (Co), nickel (Ni), molybdenum (Mo), hafnium (Hf), tantalum (Ta), tungsten (W), bismuth (Bi), silver (Ag) or an alloy or compound of these materials as these members. Each of the first gate electrode 110, the first electrode 140, and the first conductive layer 170 may be a single layer or may be a stacked layer of the materials described above.

For example, in the first electrode 140, an oxide of a metal element constituting the first conductive layer 145 in contact with the first oxide semiconductor layer 130 is more stable than an oxide of a metal element constituting the first oxide semiconductor layer 130. That is, in the case where there are a plurality of metal elements constituting the first oxide semiconductor layer 130, it is preferable that a first Gibbs free energy ($\Delta G_f$) of an oxide metal is smaller than a second Gibbs free energy ($\Delta G_f$) of an oxide metal. The first Gibbs free energy is a Gibbs free energy with regard to a metal material in contact with the first oxide semiconductor layer 130. The second Gibbs free energy is a Gibbs free energy with regard to each of the plurality of metal elements constituting the first oxide semiconductor layer 130.

For example, in the case where IGZO is used as the first oxide semiconductor layer 130, Ti may be used as a metal in contact with IGZO. The Gibbs free energy of indium oxide is greater than the Gibbs free energy of each of Ga oxide and Zn oxide. Thus, indium oxide is chemically unstable and easily reduced. On the other hand, since the Gibbs free energy of Ti oxide is sufficiently smaller than the Gibbs free energy of each of Ga oxide and Zn oxide, when Ti is formed on IGZO, Ti combines with oxygen in IGZO to form Ti oxide. Since indium oxide is easily reduced as described above, when high-energy is supplied in a state in which IGZO and Ti are in contact with each other, indium oxide is reduced and Ti is oxidized. As a result, even if it is in a step after the first electrodes 140 are formed on the first oxide semiconductor layer 130, uneven distribution of indium region is formed in the first oxide semiconductore layer 130.

A general insulating material can be used as the first gate insulating layer 120 and the first insulating layer 150. For example, as these insulating layers, it is possible to use an inorganic insulating layer such as silicon oxide ($SiO_x$), silicon oxynitride ($SiO_xN_y$), silicon nitride ($SiN_x$), silicon nitride oxide ($SiN_xO_y$), aluminum oxide ($AlO_x$), aluminum oxynitride ($AlO_xN_y$), aluminum nitride oxide ($AlN_xO_y$), aluminum nitride ($AlN_x$), and the like. A low-defect insulating layer may be used as these insulating layers. For example, when a composition ratio of oxygen in the first insulating layer 150 is compared with a composition ratio of oxygen in an insulating layer (hereinafter referred to as "other insulating layer") having the same composition as that of the first insulating layer 150, the composition ratio of oxygen in the first insulating layer 150 is closer to the stoichiometric ratio of an insulating layer having the same composition as that of the first insulating layer 150 than the composition ratio of oxygen in the other insulating layer.

$SiO_xN_y$ and $AlO_xN_y$ described above are a silicon compound and an aluminum compound containing nitrogen (N) at a smaller amount (x>y) than oxygen (O). In addition, $SiN_xO_y$ and $AlN_xO_y$ are a silicon compound and an aluminum compound containing oxygen at a smaller amount (x>y) than nitrogen.

It is possible to use a metal oxide having semiconductor characteristics as the first oxide semiconductor layer 130.

For example, it is possible to use an oxide semiconductor containing indium (In), gallium (Ga), zinc (Zn), and oxygen (O) as the first oxide semiconductor layer 130. In particular, it is possible to use an oxide semiconductor having a composition ratio of In:Ga:Zn:O=1:1:1:4 as the first oxide semiconductor layer 130. However, the oxide semiconductor containing In, Ga, Zn, and O used in this embodiment is not limited to the composition described above. It is possible to use an oxide semiconductor having a composition different from that described above. For example, the In ratio may be increased more than the ratio described above in order to improve mobility. In addition, in order to increase the band gap and reduce the influence of light irradiation, the Ga ratio may also be increased more than the ratio described above.

Other elements may also be added to the oxide semiconductor containing In, Ga, Zn, and O. For example, a metal element such as Al or Sn may be added to the oxide semiconductor. In addition to the oxide semiconductors described above, an oxide semiconductor containing In and Ga (IGO), an oxide semiconductor containing In and Zn (IZO), an oxide semiconductor containing In, Sn and Zn (ITZO), and an oxide semiconductor containing In and W and the like can be used for the first oxide semiconductor layer 130. The first oxide semiconductor layer 130 may be amorphous or crystalline. The first oxide semiconductor layer 130 may also be a mixed phase of amorphous and crystalline.

It is possible to use an oxide semiconductor layer such as an oxide semiconductor having the same composition as the first oxide semiconductor layer 130, an oxide conductive layer such as ITO, or an oxide insulating layer such as $SiO_x$, $SiO_xN_y$, $AlO_x$, and $AlO_xN_y$ as the oxide layer 160. The oxide layer 160 is preferred to be formed by a sputtering method. In the case where the oxide layer 160 is formed by a sputtering method, a process gas used in the sputtering remains in the oxide layer 160 film. For example, in the case when argon (Ar) is used as the sputtering process gas, Ar remains within the oxide layer 160 film. The remaining Ar can be detected in the oxide layer 160 by SIMS (Secondary Ion Mass Spectrometry) analysis. In the case where an oxide insulating layer having the same composition as the material which is used for the first insulating layer 150 is used as the oxide layer 160, the composition ratio of oxygen in the oxide layer 160 is larger than the composition ratio of oxygen in the first insulating layer 150.

As described above, according to the semiconductor device 10 according to the present embodiment, it is possible to improve the reliability of the semiconductor device 10 by not unevenly distributing indium in the first oxide semiconductor layer 130 of the channel region 131 but unevenly distributing the indium in the first oxide semiconductor layer 130 of the first region 133 and the second region 135.

In the present embodiment, although a bottom gate type semiconductor device 10 in which the first gate electrode 110 is provided below the first oxide semiconductor layer 130 is shown, the semiconductor device may be a top gate type semiconductor device in which the gate electrode is provided above the oxide semiconductor layer.

In the present embodiment, a configuration in which the oxide layer 160 is provided between the first insulating layer 150 and the first conductive layer 170 is illustrated but is not limited to this configuration. The oxide layer 160 is omitted, and the first conductive layer 170 may be in contact with the upper surface of the first insulating layer 150. The oxide layer 160 may be provided on the sidewalls of the first apertures 151, 153. The oxide layer 160 may be provided in a region where the first conductive layer 170 is not provided.

For example, the oxide layer 160 may be provided above the first oxide semiconductor layer 130. In other words, in a planar view, the oxide layer 160 may overlap the first oxide semiconductor layer 130.

In the present embodiment, each layer is composed of one layer. However, each layer may be a stacked structure.

Second Embodiment

A semiconductor device according to an embodiment of the present invention will be described with reference to FIGS. 11 to 17.

[Configuration of Semiconductor Device 10A]

Figure 11:
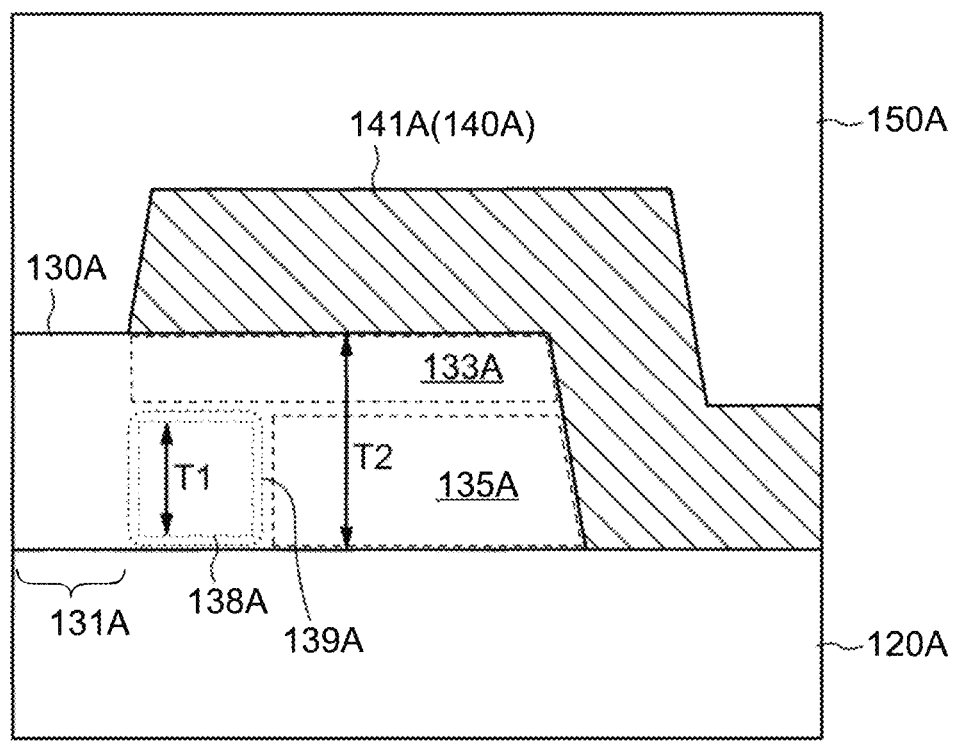
FIG. 11 is an enlarged cross-sectional view of a part of a semiconductor device according to an embodiment of the present invention.

FIG. 11 is a cross-sectional view showing an outline of a semiconductor device according to an embodiment of the present invention. The cross-sectional view shown in FIG. 11 corresponds to the cross-sectional view shown in FIG. 3. A semiconductor device 10A shown in FIG. 11 is similar to the semiconductor device 10 shown in FIGS. 1 to 3 but is different in that the region where indium is unevenly distributed in the first oxide semiconductor layer 130A below the first electrode 140 is different from the semiconductor device 10. In the explanation of the following semiconductor device 10A, the same features as the semiconductor device 10 will be omitted, and the differences from the semiconductor device 10 will be mainly explained.

As shown in FIG. 11, the first oxide semiconductor layer 130A is provided with a channel region 131A, a first region 133A, a second region 135A, and a third region 139A. The channel region 131A is a region in which the first electrode 140A is not provided above the first oxide semiconductor layer 130A. The first region 133A, the second region 135A, and the third region 139A are regions in which the first electrode 140A is provided above the first oxide semiconductor layer 130A. In other words, the channel region 131A is a region exposed from the first electrode 140A in a planar view. The first region 133A, the second region 135A, and the third region electrode 139A are regions overlapping the first electrode 140A in a planar view.

As shown in FIG. 11, in a cross-sectional view, the third region 139A is provided between a first gate insulating layer 120A and the first region 133A. The third region 139A is provided between the channel region 131A and the second region 135A. In other words, the third region 139A extends from below the end portion of the first electrode 140A on the channel region 131A side towards the inside of the patterns of the first electrode 140A.

The third region 139A includes a square 138A of a predetermined size in a cross-sectional view. In other words, in a cross-sectional view, the square 138A is surrounded by the outer edge of the third region of 139A. The square 138A in a cross-sectional view is a square in which the length of one side is half or more of the film thickness of the first oxide semiconductor layer 130A in the region overlapping the first electrode 140A in a planar view. Specifically, the length T1 of one side of the square 138A included in the third region 139A is half (T2/2) or more of the length of the film thickness T2 of the first oxide semiconductor layer 130A in the region overlapping with the first electrode 140A in planar view. That is, the width of the vertical and horizontal in a cross-sectional view of the third region 139A is greater than half (T2/2) of the film thickness T2 of the first oxide semiconductor layer 130A. As will be described in detail later, the semiconductor device 10A according to the second embodiment of the present invention includes the third region 139A having the following features, thereby improving the electrical characteristics of the semiconductor device 10A. This effect is remarkable in the case where the third region 139A satisfies the above condition.

Each of the channel region 131A, the first region 133A, the second region 135A, and the third region 139A is formed from one oxide semiconductor layer, and each of the regions has the same composition and the same crystalline state immediately after film formation. However, in the first oxide semiconductor layer 130A, the compositions and crystalline states of the first oxide semiconductor layer 130A in the above regions differ depending on the effect of the manufacturing process of the semiconductor device 10A.

Since the degree of uneven distribution of indium in the channel region 131A, the first region 133a, and the second region 135A is the same as that in the first embodiment, the explanation thereof is omitted. In the first oxide semiconductor layer 130A in the region 139A, indium is not unevenly distributed as in the channel region 131A. The presence or absence of unevenly distributed indium in the first oxide semiconductor layer 130A may vary depending on the method of measurement and the accuracy of the measurement, but if it is evaluated that indium is unevenly distributed in the first oxide semiconductor layer 130A in the third region layer 139A, the degree of uneven distribution of indium in the first oxide semiconductor layer 130A is smaller in the third region 139A than in the first region 133A and the second region 135A. In other words, in the third region 139A, indium is more uniformly present than in the first region 133A and the second region 135A. In this case, the degree of uneven distribution of indium is substantially the same in the channel region 131A and the third region 139A. That is, for example, there is little difference between the channel region 131A and the third region 139A in the observation results of cross-sectional TEM images, cross-sectional STEM images, cross-sectional SEM images, or planar analyses of EDX. In other words, in the above observation results, the first oxide semiconductor layers 130A of the channel region 131A and the third region 139A are continuously connected.

[Uneven Distribution of Indium in the First Oxide Semiconductor Layer 130A]

An uneven distribution of indium in the channel region 131A, the first region 133A, the second region 135A, and the third region 139A of the first oxide semiconductor layer 130A will be described with reference to FIG. 12 to FIG. 15B.

Figure 12:
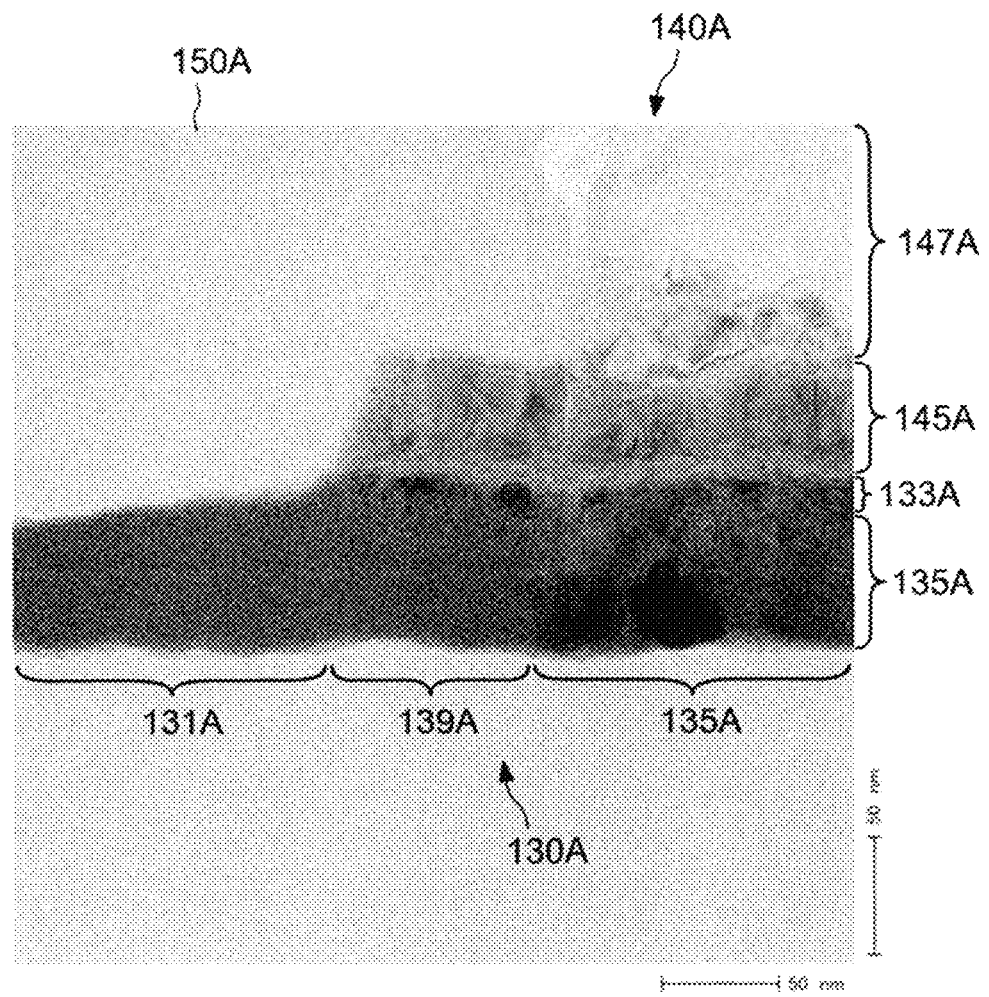
FIG. 12 is a cross-sectional TEM image of a semiconductor device according to an embodiment of the present invention.

FIG. 12 is a cross-sectional TEM image of a semiconductor device according to an embodiment of the present invention. As in FIG. 4, a structure in which a titanium layer 145A and an aluminum layer 147A are stacked from below is used as the first electrode 140A. IGZO is used as the first oxide semiconductor layered 130A. In FIG. 12, the positions of the channel region 131A, the first region 133A, the second region 135A, and the third region 139A are as shown in the drawings. The first region 133A is provided below the first electrode 140A, and the second region 135A and the third 139A are provided adjacent to each other below the first region 133A. The third region 139A is provided between the channel region 131A and the second region 135A.

As shown in FIG. 12, the first oxide semiconductor layer 130A in the third region 139A, similar to the first oxide semiconductor layer 130A in the channel region 131A, with respect to the brightness and darkness in the contrast of the cross-sectional image, the "bright" portion and the "dark" portion are substantially uniformly present. Therefore, it is determined that indium is not unevenly distributed in the first oxide semiconductor layer 130A in the third region 139A.

Since the uneven distribution of indium in the first oxide semiconductor layer 130A in each of the channel region 131A, the first region 133A, and the second region 135A has the same tendency as shown in FIG. 4, these explanations will be omitted.

Figure 13A:
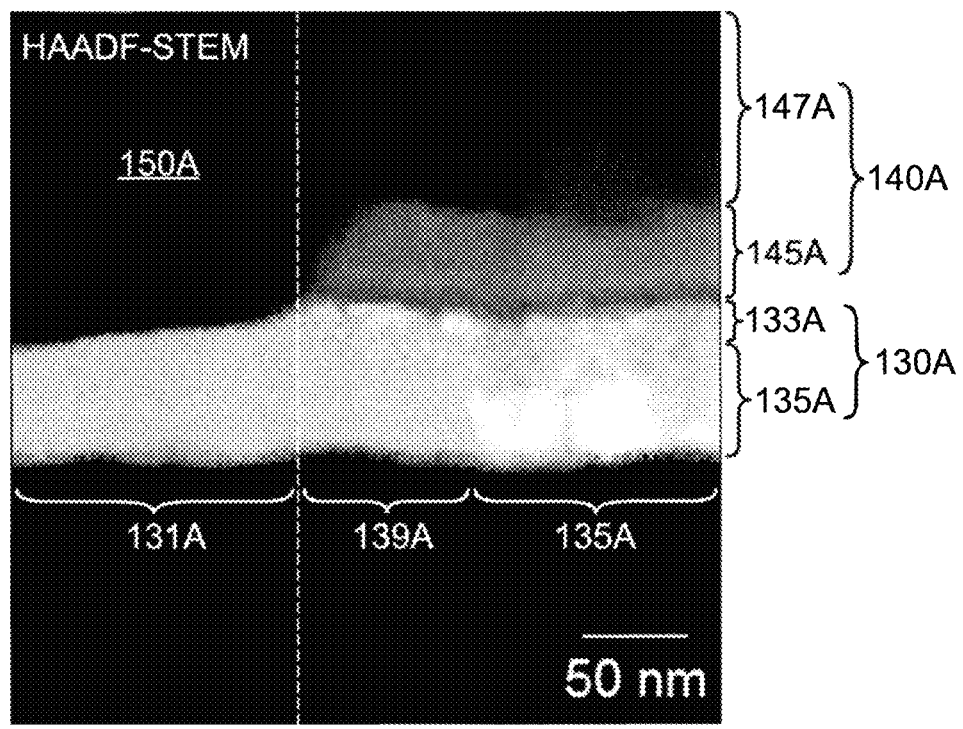
FIG. 13A is a cross-sectional STEM image of a semiconductor device according to an embodiment of the present invention.
Figure 13B:
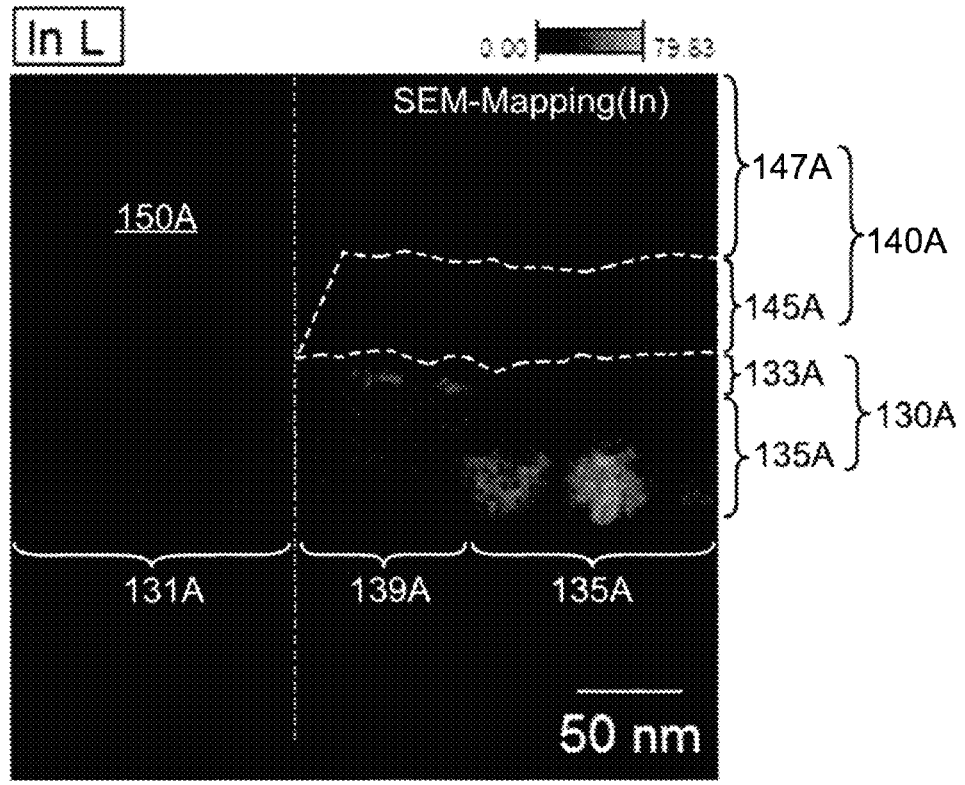
FIG. 13B is an EDX mapping measurement result of a semiconductor device according to an embodiment of the present invention.

FIG. 13A and FIG. 13B are cross-sectional STEM images of the semiconductor device according to an embodiment of the present invention and the corresponding EDX mapping measurement results. The sample of the cross-sectional STEM image shown in FIG. 13A is the same as the sample of the cross-sectional TEM image shown in FIG. 12.

A dotted line extending vertically to a position corresponding to the end portion of the first electrode 140A (end portion at the lower left of the titanium layer 145A of the first electrode 140A in FIGS. 13A and 13B) is shown in each of the STEM image of FIG. 13A and the EDX mapping image of FIG. 13B. In the EDX mapping image, a region corresponding to the titanium layer 145A is surrounded by a dotted line.

As shown in the STEM image of FIG. 13A, the channel region 131A and the third region 139A of the first oxide semiconductor layer 130A are regions with high uniformity compared to other regions. Alternatively, the channel region 131A and the third region 139A of the first oxide semiconductor layer 130A are regions that are smaller in size of the mass of the "bright" portion than other regions. That is, the channel region 131A and the third region 139A are regions without uneven distribution of indium in the first oxide semiconductor layer 130A.

As shown in the EDX mapping image of FIG. 13B, in the first oxide semiconductor layer 130A in the channel region 131A and the third region 139A, indium is uniformly present as compared to the first oxide semiconductor layer 130A in the first region 133A and the second region 135A. As in FIG. 5B, indium is unevenly distributed in the first oxide semiconductor layer 130A of the first region 133A and the second region 135A.

Figure 14A:
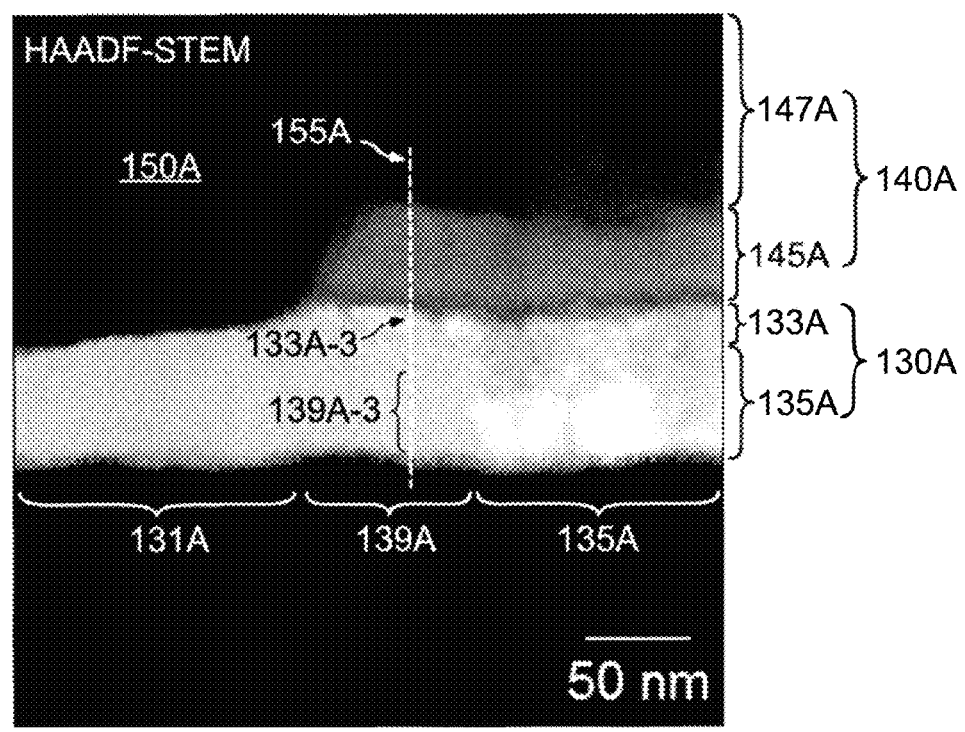
FIG. 14A is a cross-sectional STEM image of a semiconductor device according to an embodiment of the present invention.
Figure 14B:
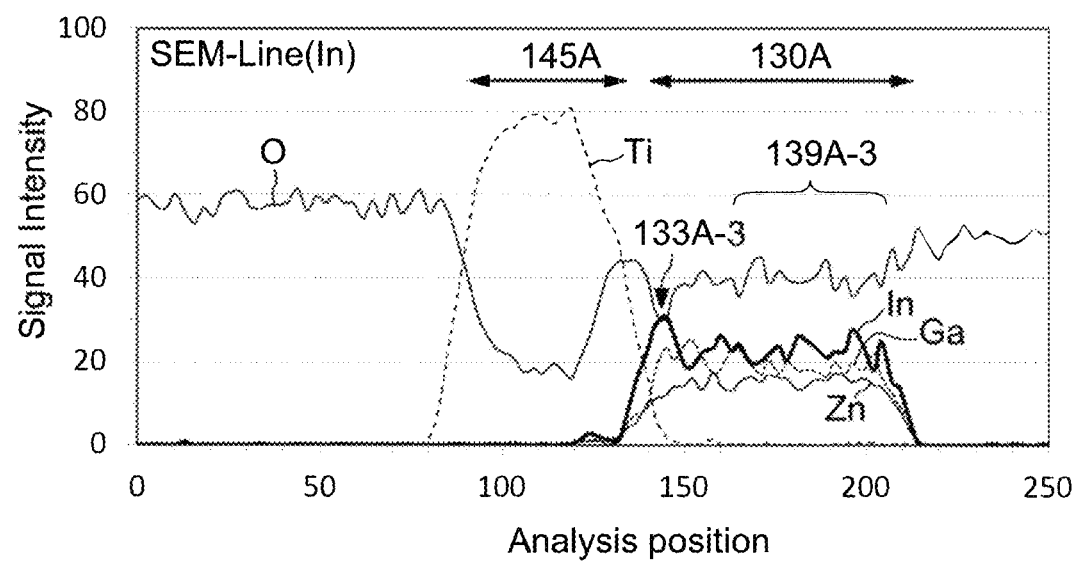
FIG. 14B is a line analysis result of EDX of a semiconductor device according to an embodiment of the present invention.
Figure 15A:
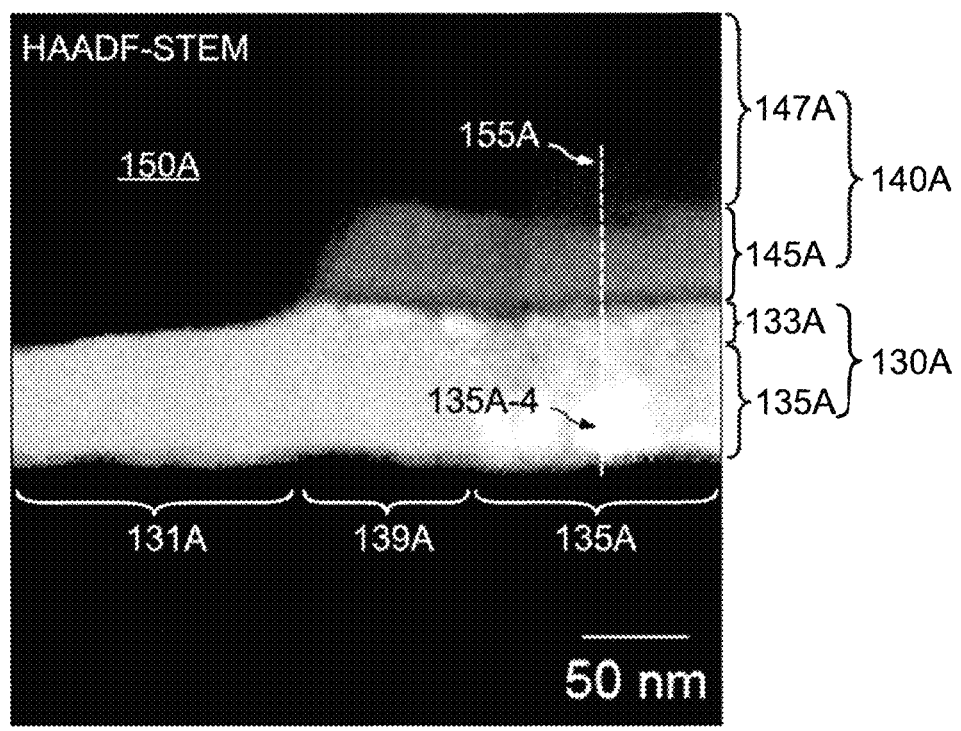
FIG. 15A is a cross-sectional STEM image of a semiconductor device according to an embodiment of the present invention.
Figure 15B:
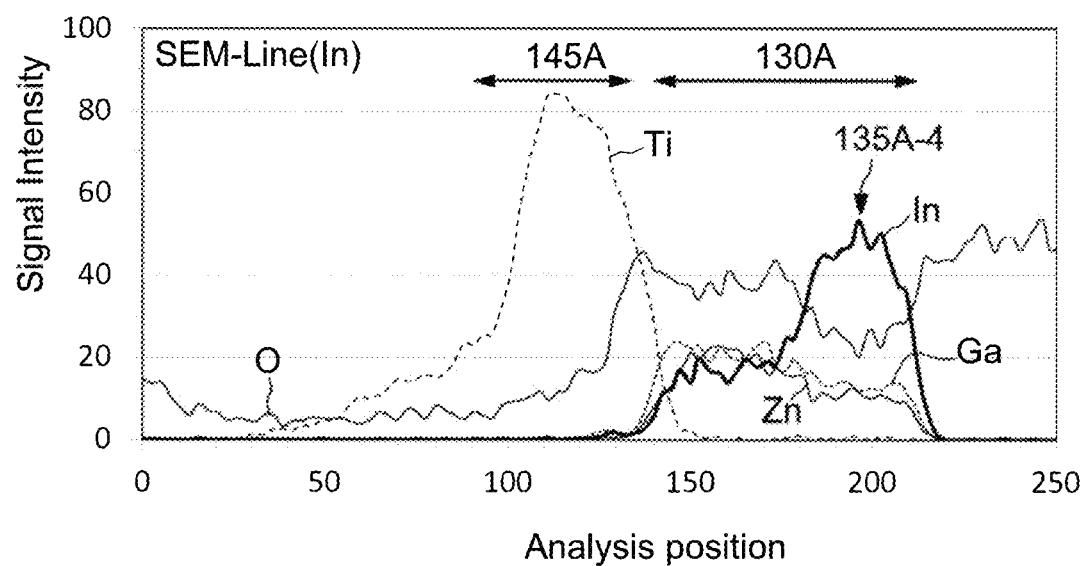
FIG. 15B is a line analysis result of EDX of a semiconductor device according to an embodiment of the present invention.

FIG. 14A, FIG. 14B, FIG. 15A, and FIG. 15B are cross-sectional STEM images of a semiconductor device according to an embodiment of the present invention, and EDX line analysis results obtained by measuring a part of the cross-sectional images. The sample of the cross-sectional STEM images shown in FIGS. 14A and 15A are the same as the sample of the cross-sectional STEM image shown in FIG. 13A. In the STEM images of FIG. 14A and FIG. 15A, a region where the EDX line analysis has been performed is indicated by a dotted line. Since the spectrums shown in the EDX line analysis results of FIGS. 14B and 15B are the same as shown in FIG. 6, the explanation thereof is omitted.

In the STEM images of FIG. 14A and FIG. 15A, indium dense regions 133A-3 (see FIG. 14A) and 135A-4 (see FIG. 15A) exist in the first region 133A and the second region 135A, respectively. As shown in the EDX line analysis results of FIG. 14B and FIG. 15B, peaks are confirmed in the In spectrum in the indium dense regions. When particular attention is paid to the spectrum of the indium-dense region 135A-4, the signal strengths of Ga, Zn, and O decrease in the region where a large peak of In exists. In other words, in the indium-dense region 135A-4, it is considered that In is dense or crystallized, and a composition that is different from IGZO is locally formed.

[Comparison of Electrical Characteristics of Semiconductor Device according to the First Embodiment and the Second Embodiment]

Figure 16A:
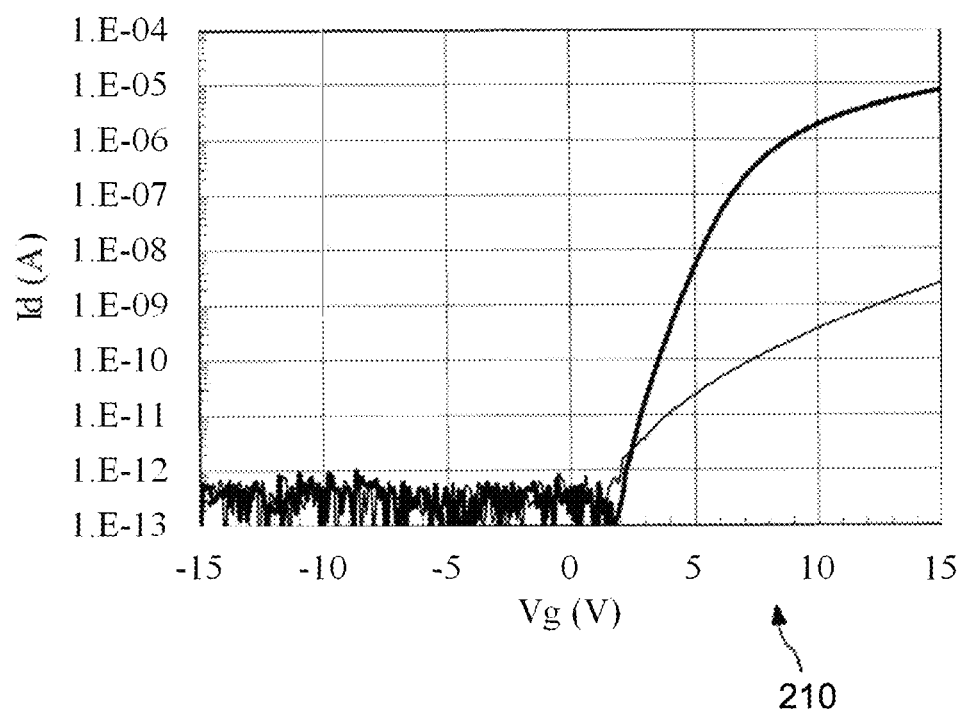
FIG. 16A is a diagram showing electrical characteristics of a semiconductor device according to a first embodiment of the present invention.
Figure 16B:
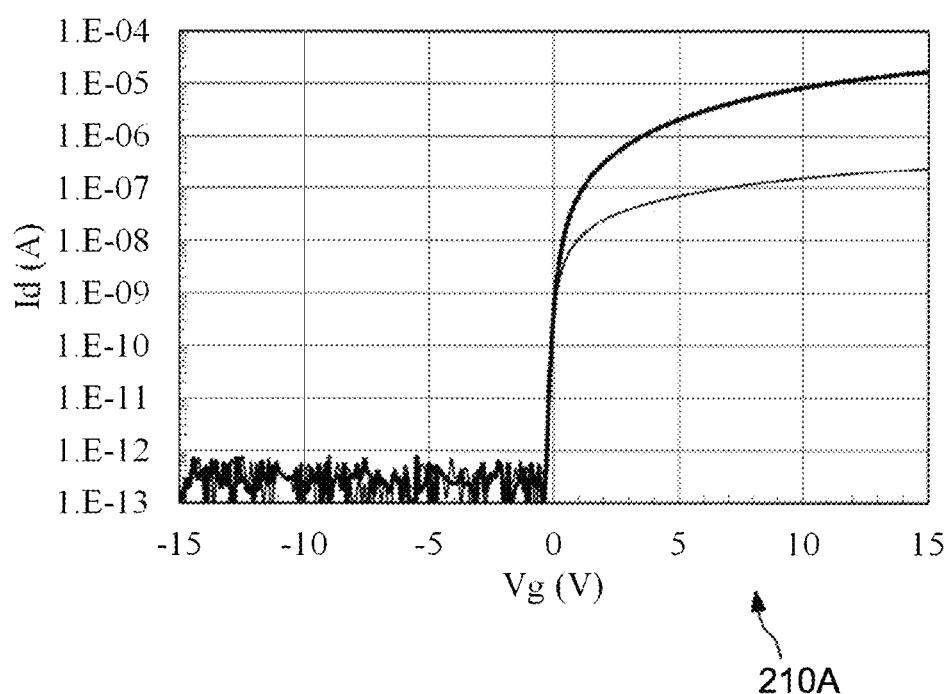
FIG. 16B is a diagram showing electrical characteristics of a semiconductor device according to a second embodiment of the present invention.

FIG. 16A is a diagram showing electrical characteristics of the semiconductor device according to the first embodiment of the present invention. FIG. 16B is a diagram showing electrical characteristics of the semiconductor device according to the second embodiment of the present invention. Electrical characteristics 210 of FIG. 16A are the electrical characteristics of the semiconductor device 10 according to the first embodiment. Electrical characteristics 210A of FIG. 16B are the electrical characteristics of the semiconductor device 10A according to the second embodiment. The [channel length/channel widths] of the semiconductor device used in the test are all [3.5 μm/4.0 μm].

The measurement condition of the electrical characteristics shown in FIG. 16A and FIG. 16B is as follows.

Source-drain voltage: 0.1V, 10V
Gate scan voltage: −15V to 15V
Measurement environment: Dark room
Stage temperature at measurement: R.T.

As shown in FIG. 16A and FIG. 16B, the semiconductor device 10A (the electrical characteristics 210A) according to the second embodiment has a steeper ON current rise as compared to the semiconductor device 10 (the electrical characteristics 210) according to the first embodiment.

The structural difference between the semiconductor device 10 according to the first embodiment and the semiconductor device 10A according to the second embodiment is that in the semiconductor device 10, the second region 135 in which indium is unevenly distributed exists up to the vicinity of the channel region 131, whereas in the semiconductor device 10A, the third region 139A in which indium is not segregated (or the degree of uneven distribution of indium is smaller than in the second region 135A) exists between the channel region 131A and the second region 135A.

The third region 139A needs to have a certain size or more. As shown in FIG. 16, in order to obtain electrical characteristics in which the ON current rises steeply, the third region 139A must be present continuously in a wider region than the square 138A (see FIG. 11). In the present embodiment, a configuration in which the length T1 of one side of the square 138A is half (T2/2) or more of the thickness T2 of the first oxide semiconductor layers 130A in the region overlapping the first electrodes 140A in planar view is exemplified but is not limited to this configuration. The length T1 of one side of the square 138A may be 60% or more, 70% or more, 80% or more, or 90% or more of the film thickness T2.

As described in the first embodiment, in the first oxide semiconductor layer 130 below the first electrode 140, the indium contained in the first oxide semiconductor layer 130 is unevenly distributed (or crystallized), whereby the reliability at least in a NBTIS test can be improved. On the other hand, as shown in the first embodiment, when the second region 135 is present up to the vicinity of the channel region 131, the rise of the ON current becomes gentle.

For example, in IZGO, it is known that a conductive band is formed by a 5 s orbital of indium. It is considered that, when the IZGO composition is biased with the uneven distribution of indium as in the case of the second region 135, a conductive path is interrupted and the resistance of an IZGO film becomes large. For this reason, in the case of the semiconductor device 10 of the first embodiment, since the resistance of the first oxide semiconductor layer 130 in the second region 135 near the channel region 131 is high, it is inferred that the rise of the ON current became slow.

Figure 17:
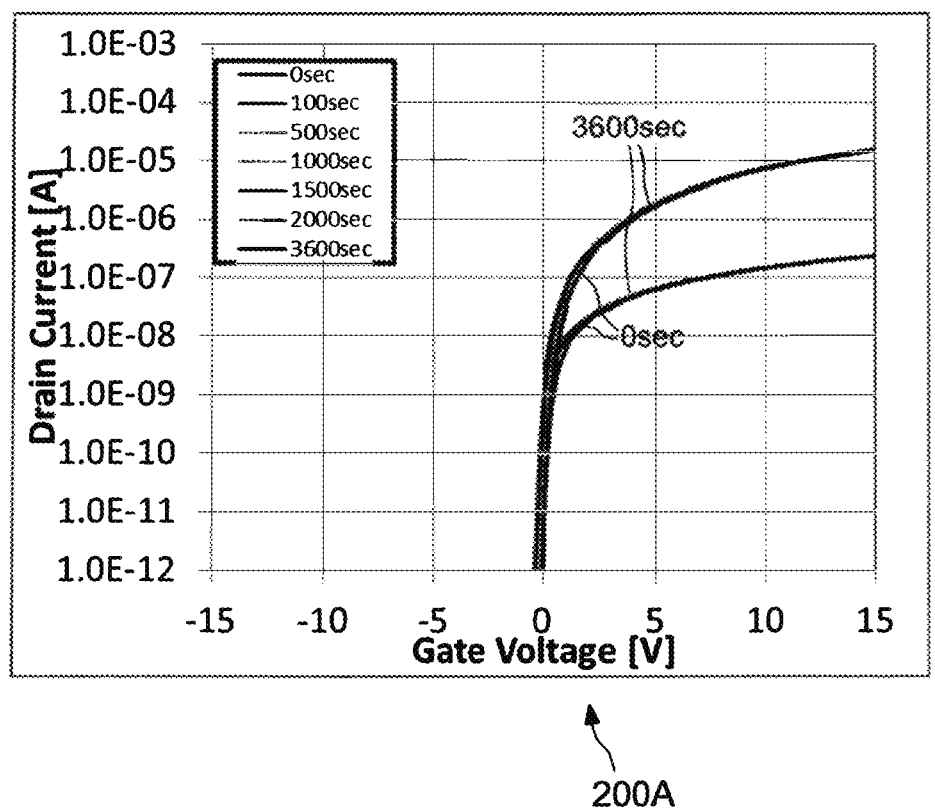
FIG. 17 is a diagram showing a reliability test result of a semiconductor device according to an embodiment of the present invention.

On the other hand, in the semiconductor device mode 10A according to the second embodiment, since the third region 139A between the channel region 131A and the second region 135A is a region where indium is not unevenly distributed, it is considered that the resistance value of the first semiconductor device layer 130A in the third region 139A is smaller than the resistance value of the first oxide semiconductor layer 130A in the second region 135A. As a result, it is presumed that the rise of the ON current of the semiconductor device 10A is steeper than the semiconductor device 10. As shown in FIG. 17, the reliability of the semiconductor device 10A in the NBTIS test is also improved compared to the conventional semiconductor device 10Z (reference FIG. 10A) as well as the reliability of the semiconductor device 10 (see FIG. 10B). In FIG. 17, a test result 200A is the result of the reliability test performed on the semiconductor device 10A of the second embodiment.

As described above, according to the semiconductor device 10A according to the second embodiment, it is possible to improve the reliability similar to the semiconductor device 10 according to the first embodiment, and the electrical characteristics in which the rise of the ON current is steep as described above can be obtained.

Third Embodiment

A display device using a semiconductor device according to an embodiment of the present invention will be described with reference to FIGS. 18 to 22. In the embodiment shown below, a configuration in which the semiconductor device described in the first embodiment and the second embodiment is applied to liquid crystal display device circuits will be described.

[Outline of Display Device 20B]

Figure 18:
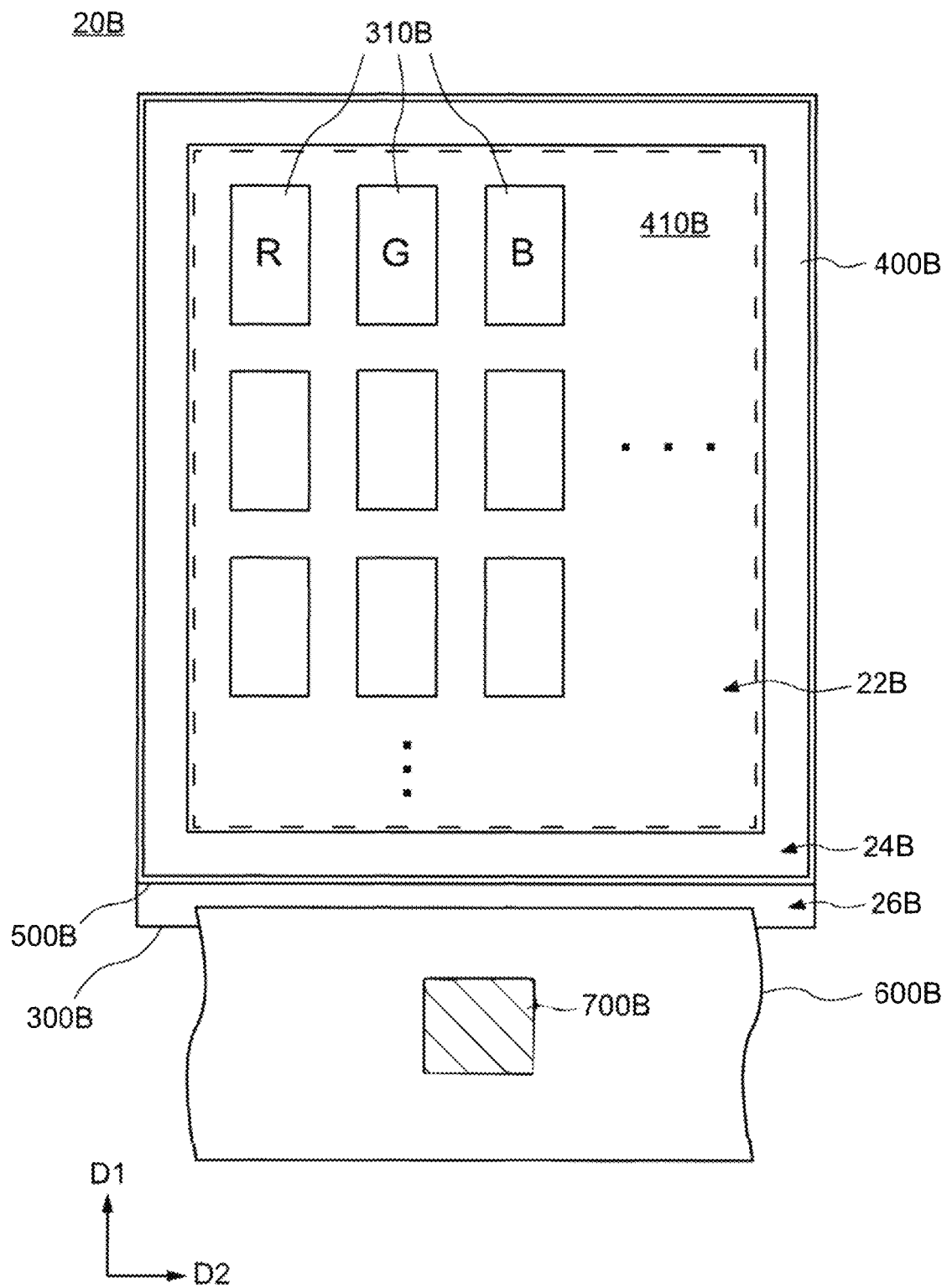
FIG. 18 is a plan view showing an outline of a display device according to an embodiment of the present invention.

FIG. 18 is a plan view showing an outline of a display device according to an embodiment of the present invention. As shown in FIG. 18, a display device 20B includes an array substrate 300B, a seal portion 400B, a counter substrate 500B, a flexible printed circuit substrate 600B (FPC 600B), and an IC chip 700B. The array substrate 300B and the counter substrate 500B are bonded together by the seal portion 400B. A plurality of pixel circuits 310B is arranged in a matrix in a liquid crystal region 22B which is surrounded by the seal portion 400B. The liquid crystal region 22B is a region which overlaps a liquid crystal element 410B described herein in a plan view.

A seal region 24B in which the seal portion 400B is provided is a region in the periphery of the liquid crystal region 22B. The FPC 600B is provided in a terminal region 26B. The terminal region 26B is a region where the array substrate 300B is exposed from the counter substrate 500B, and is provided outside the seal region 24B. Furthermore, the outside of the seal region 24B means a region in which the seal portion 400B is provided and the outside of the region surrounded by the seal portion 400B. The IC chip 700B is provided above the FPC 600B. The IC chip 700B supplies a signal for driving each pixel circuit 310B.

[Circuit Configuration of Display Device 20B]

Figure 19:
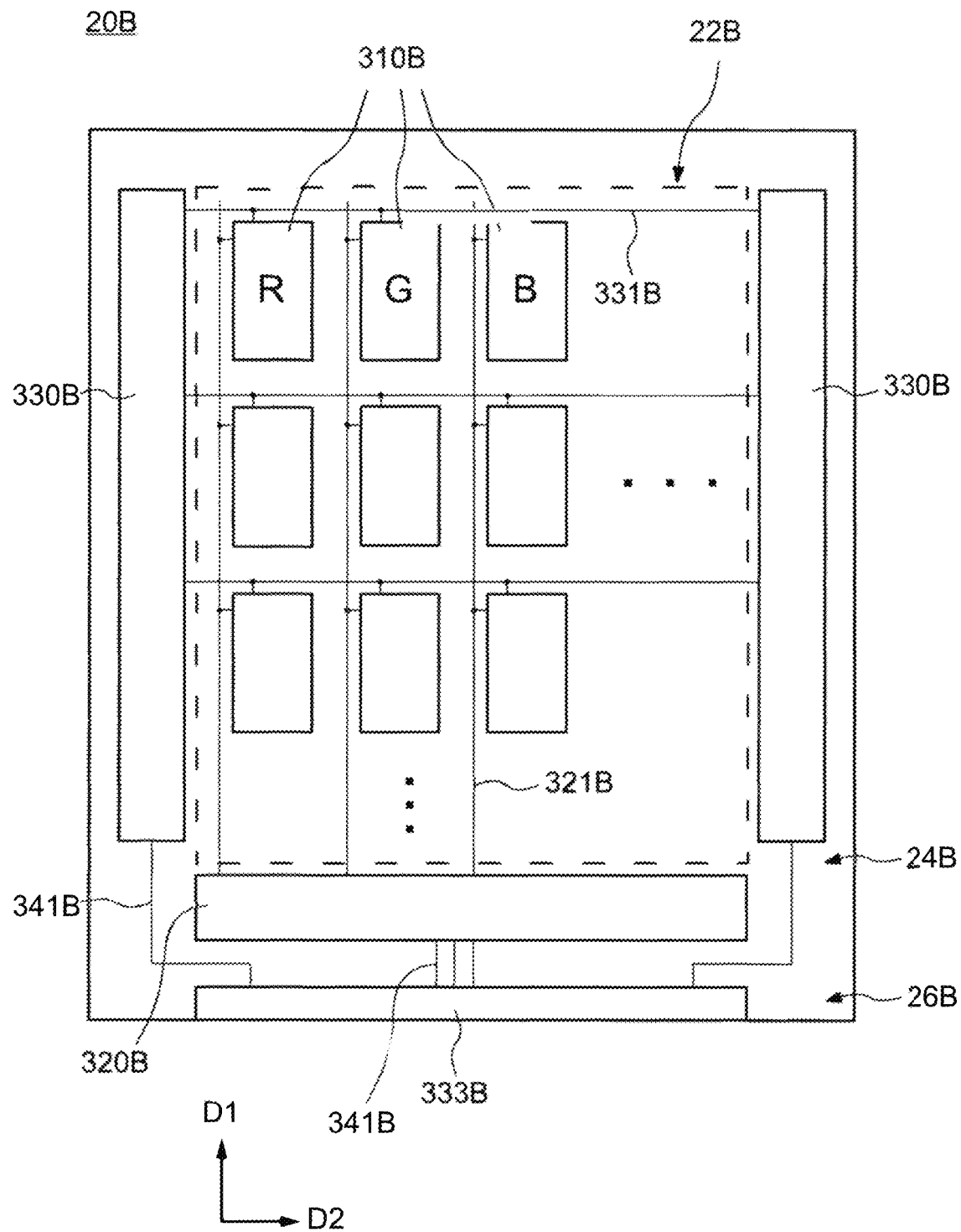
FIG. 19 is a block diagram showing a circuit configuration of a display device according to an embodiment of the present invention.

FIG. 19 is a block diagram showing a circuit configuration of a display device according to an embodiment of the present invention. As is shown in FIG. 19, a source driver circuit 320B is provided at a position adjacent in the D1 direction (column direction) of the liquid crystal region 22B where the pixel circuit 310B is arranged, and a gate driver circuit 330B is provided at a position adjacent in the D2 direction (row direction) of the liquid crystal region 22B. The source driver circuit 320B and the gate driver circuit 330B are provided in the seal region 24B described above. However, the region where the source driver circuit 320B and the gate driver circuit 330B are arranged is not limited to the seal region 24B. The source driver circuit 320B and the gate driver circuit 330B may be arranged in a region outside a region where the pixel circuit 310B is provided.

A source wiring 321B extends from the source driver circuit 320B in the D1 direction and is connected to a plurality of pixel circuits 310B arranged in the D1 direction. A gate wiring 331B extends from the gate driver circuit 330B in the D2 direction and is connected to a plurality of pixel circuits 310B arranged in the D2 direction.

A terminal portion 333B is provided in the terminal region 26B. The terminal portion 333B and the source driver circuit 320B are connected by a connection wiring 341B. Similarly, the terminal portion 333B and the gate driver circuit 330B are connected by the connection wiring 341B. By connecting the FPC 600B to the terminal portion 333B, an external device which is connected to the FPC 600B and the display device 20B are connected, and a signal from the external device drives each pixel circuit 310B provided in the display device 20B.

The semiconductor device shown in the first embodiment and the second embodiment is applied to transistors included in the pixel circuit 310B, the source driver circuit 320B, and the gate driver circuit 330B.

[Pixel Circuit 310B of Display Device 20B]

Figure 20:
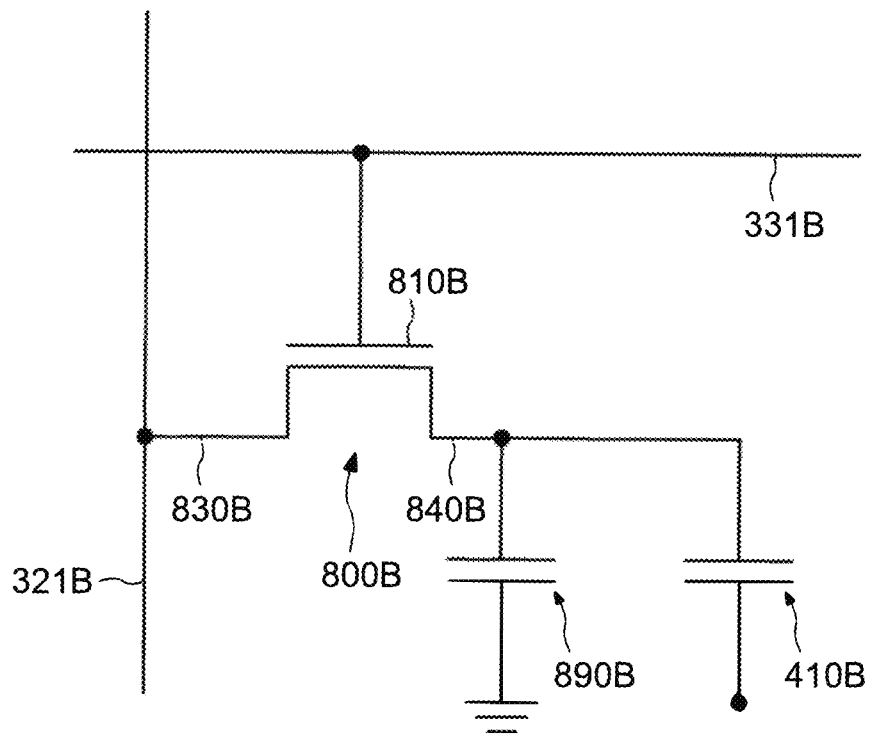
FIG. 20 is a circuit diagram showing a pixel circuit of a display device according to an embodiment of the present invention.

FIG. 20 is a circuit diagram showing a pixel circuit of a display device according to an embodiment of the present invention. As shown in FIG. 20, the pixel circuit 310B includes elements such as a transistor 800B, a storage capacitor 890B, and a liquid crystal element 410B. The transistor 800B includes a first gate electrode 810B, a first source electrode 830B and a first drain electrode 840B. The first gate electrode 810B is connected to the gate wiring 331B. The first source electrode 830B is connected to the source wiring 321B. The first drain electrode 840B is connected to the storage capacitor 890B and the liquid crystal element 410B. The semiconductor device shown in the first embodiment and the second embodiment is applied to the transistor shown in FIG. 20. Furthermore, although the first source electrode 830B is referred to as a source electrode and the first drain electrode 840B is referred to as a drain electrode in the present embodiment for the convenience of explanation, the function as the source and the function as the drain of each electrode may be interchanged.

[Cross-Sectional Structure of Display Device 20B]

Figure 21:
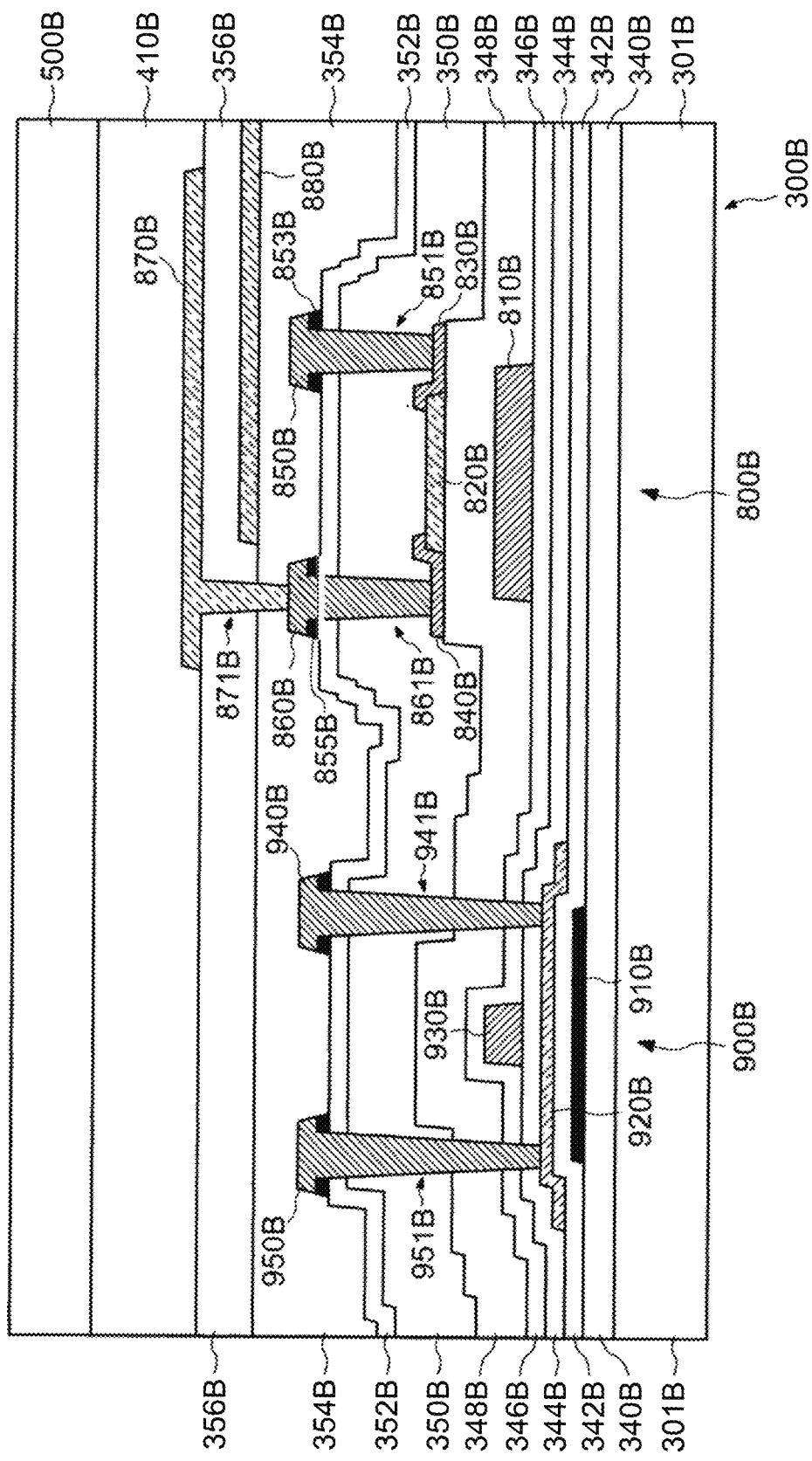
FIG. 21 is a cross-sectional view of a display device according to an embodiment of the present invention.

FIG. 21 is a cross-sectional view of a display device according to an embodiment of the present invention. As is shown in FIG. 21, the display device 20B is a display device in which transistors 800B and 900B which have different structures are provided above the same substrate. The structure of the transistor 800B is different from the structure of the transistor 900B. Specifically, the transistor 800B is a bottom-gate type transistor in which the first oxide semiconductor layer 820B is used as a channel. The transistor 900B is a top-gate type transistor in which a semiconductor layer 920B is used as a channel. For example, the transistor 800B is used for the pixel circuit 310B, and the transistor 900B is used for the source driver circuit 320B and the gate driver circuit 330B. Furthermore, the transistor 900B may be used for the pixel circuit 310B.

The transistor 800B is a transistor formed on the substrate 301B, and the transistor having insulating layers 340B, 342B, 344B, and 346B as base layers. A first gate electrode 810B is provided on the insulating layer 346B. A first oxide semiconductor layer 820B is provided above the first gate electrode 810B. The first gate electrode 810B is opposed to the first oxide semiconductor layer 820B. An insulating layer 348B which functions as a gate insulating layer is provided between the first gate electrode 810B and the first oxide semiconductor layer 820B. The first source electrode 830B is provided at one end portion of a pattern of the first oxide semiconductor layer 820B, and the first drain electrode 840B is provided at the other end portion of a pattern of the first oxide semiconductor layer 820B. The first source electrode 830B and the first drain electrode 840B are connected to the first oxide semiconductor layer 820B on the top surface and side surface of the first oxide semiconductor layer 820B, respectively.

First insulating layers 350B and 352B are provided on the first oxide semiconductor layer 820B, the first source electrode 830B, and the first drain electrode 840B. Apertures 851B and 861B are provided in the first insulating layers 350B and 352B. A first source wiring 850B is provided above the first insulating layer 352B and inside the aperture 851B. A first drain wiring 860B is provided above the first insulating layer 352B and inside the aperture 861B. An oxide layer 853B is provided between the top surface of the first insulating layers 352B and the first source wiring 850B. An oxide layer 855B is arranged between the top surface of the first insulating layers 352B and the first drain wiring 860B.

A second insulating layer 354B is provided above the first source wiring 850B and the first drain wiring 860B. A common electrode 880B which is provided in common for a plurality of pixels is provided above the second insulating layer 354B. A second insulating layer 356B is provided above the common electrode 880B. A third aperture 871B is provided in the second insulating layers 354B and 356B. A pixel electrode 870B is provided above the second insulating layer 356B and inside the third aperture 871B. The pixel electrode 870B is connected to the first drain wiring 860B.

Figure 22:
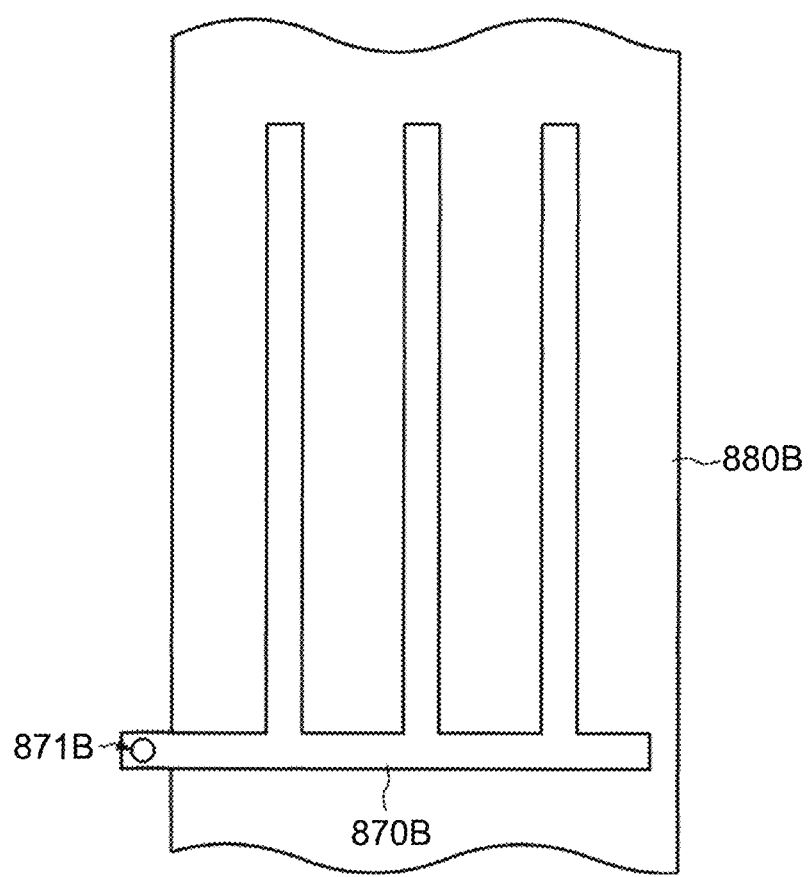
FIG. 22 is a plan view of a pixel electrode and a common electrode of a display device according to an embodiment of the present invention.

FIG. 22 is a plan view of a pixel electrode and a common electrode of a display device according to an embodiment of the present invention. As is shown in FIG. 22, the common electrode 880B has an overlapping region which overlaps the pixel electrode 870B in a plan view, and a non-overlapping region which does not overlap the pixel electrode 870B. When a voltage is supplied between the pixel electrode 870B and the common electrode 880B, a horizontal electric field is formed from the pixel electrode 870B in the overlapping region toward the common electrode 880B in the non-overlapping region. The gradation of the pixel is determined by the operation of liquid crystal molecules which are included in the liquid crystal element 410B by the horizontal electric field.

In the structure described above, it is possible to apply the semiconductor devices 10 or 10A in FIGS. 1, 3 and 11 as the transistor 800B. In this case, when FIG. 1 is compared with FIG. 21, each member in each drawing corresponds as follows. The first gate electrode 110 corresponds to the first gate electrode 810B. The first gate insulating layer 120 corresponds to the insulating layer 348B. The first oxide semiconductor layer 130 corresponds to the first oxide semiconductor layer 820B. The first source electrode 141 corresponds to the first source electrode 830B. The first drain electrode 143 corresponds to the first drain electrode 840B. The first insulating layer 150 corresponds to the first insulating layers 350B and 352B. The first aperture 151 corresponds to the aperture 851B. The first aperture 153 corresponds to the aperture 861B. The oxide layer 160 corresponds to the oxide layers 853B and 855B. The first source wiring 171 corresponds to the first source wiring 850B. The first drain wiring 173 corresponds to the first drain wiring 860B.

The transistor 900B is a transistor formed in the substrate 301, and has the insulating layer 340B as a base layer. A light shielding layer 910B is provided on the insulating layer 340B. The insulating layer 342B is provided over the light shielding layer 910B. The semiconductor layer 920B is arranged above the insulating layer 342B. A second gate electrode 930B is provided above the semiconductor layer 920B. The insulating layer 344B which functions as a gate insulating layer is provided between the semiconductor layer 920B and the second gate electrode 930B. The insulating layers 346B, 348B, 350B, and 352B are provided above the second gate electrode 930B. Apertures 941B and 951B are provided in these insulating layers. A second source wiring 940B is provided above the insulating layer 352B and inside the aperture 941B. A second drain wiring 950B is provided above the insulating layer 352B and inside the aperture 951B. The second insulating layer 354B is provided above the second source wiring 940B and the second drain wiring 950B. In other words, the second gate electrode 930B is provided under a layer (insulating layer 348B) which is the same layer as the gate insulating layer of the transistor 800B.

Fourth Embodiment

Figure 23:
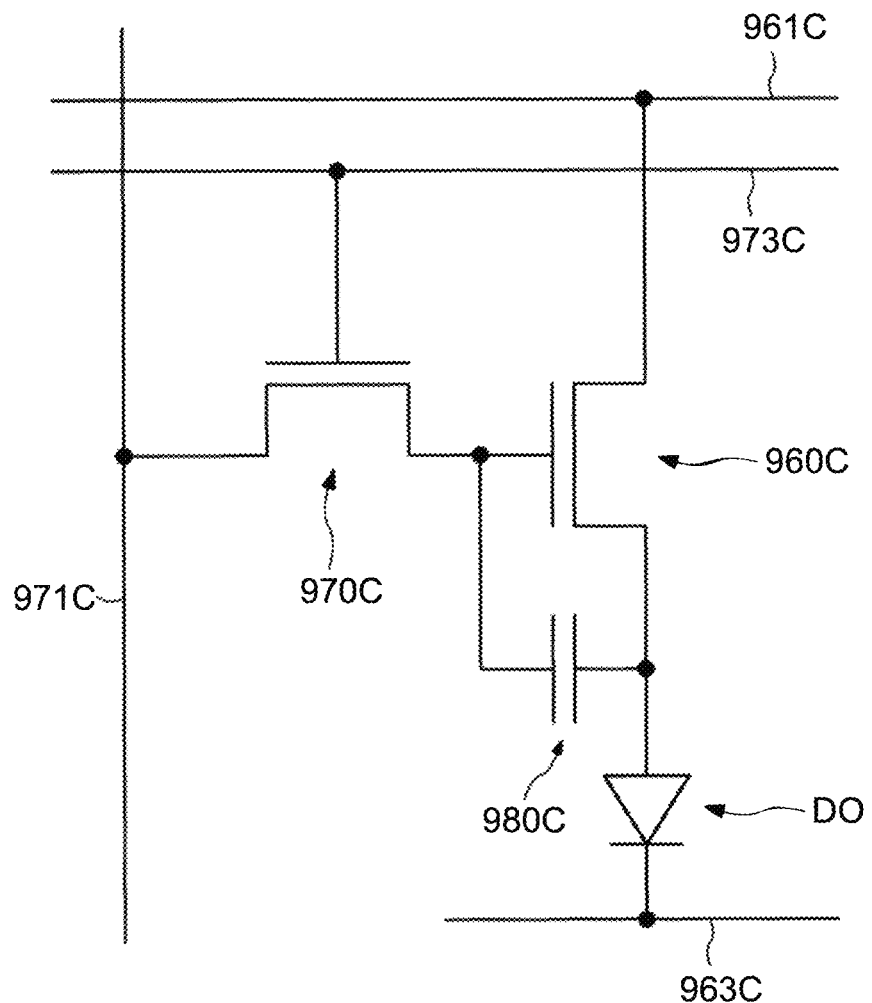
FIG. 23 is a circuit diagram showing a pixel circuit of a display device according to an embodiment of the present invention.
Figure 24:
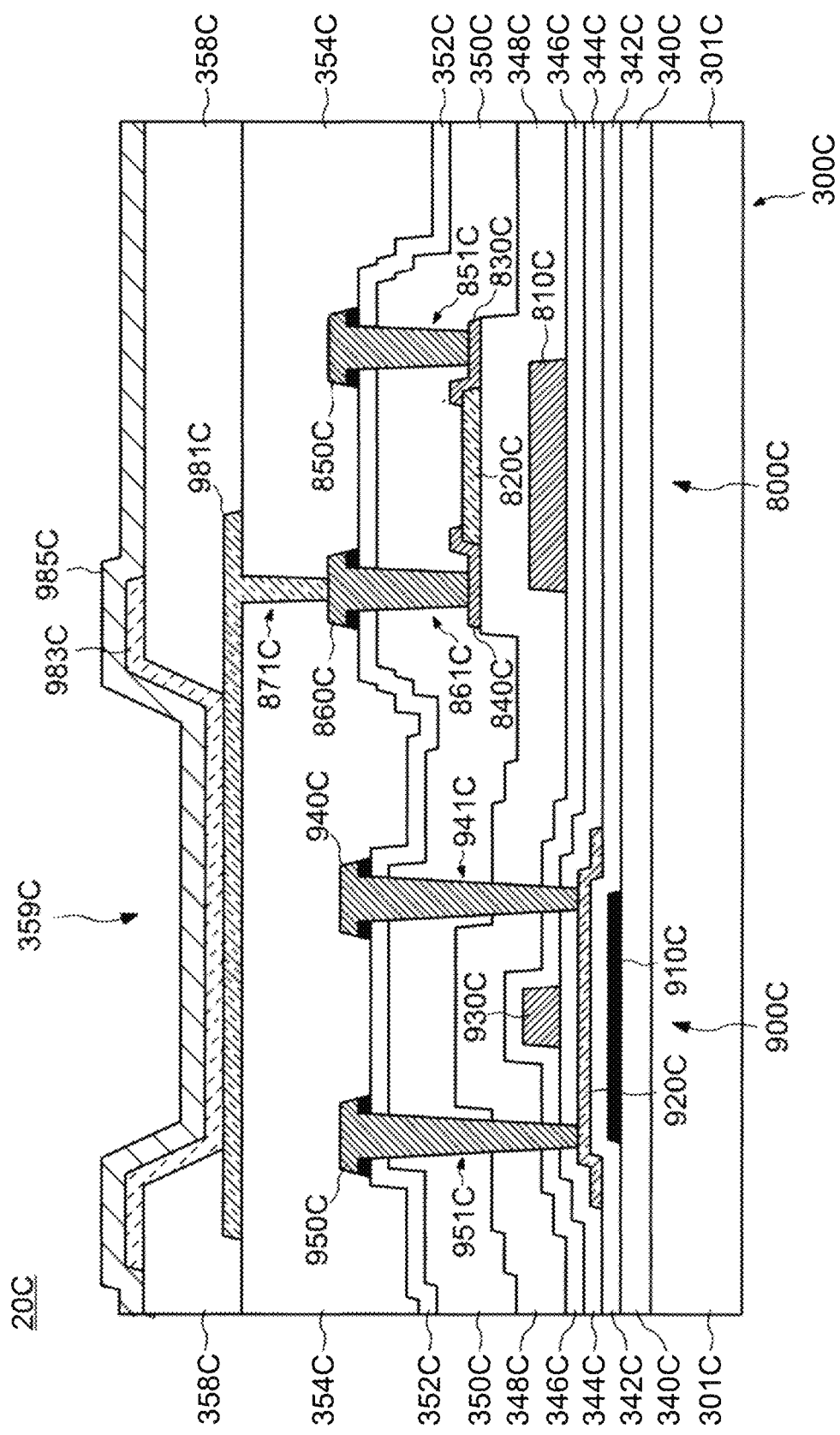
FIG. 24 is a cross-sectional view of a display device according to an embodiment of the present invention.

A display device using a semiconductor device according to an embodiment of the present invention is explained using FIG. 23 and FIG. 24. In the embodiment described below, a structure is explained in which the semiconductor device explained in the first embodiment and second embodiment is applied to a circuit of an organic EL display device. Since an outline and circuit configuration of a display device 20C are the same as those shown in FIG. 18 and FIG. 19, an explanation is omitted.

[Pixel Circuit 310C of Display Device 20C]

FIG. 23 is a circuit diagram showing a pixel circuit of a display device according to an embodiment of the present invention. As is shown in FIG. 23, a pixel circuit 310C includes elements such as a drive transistor 960C, a selection transistor 970C, a storage capacitor 980C, and a light emitting element DO. The source electrode of the selection transistor 970C is connected to a signal line 971C, and the gate electrode of the selection transistor 970C is connected to a gate line 973C. The source electrode of the drive transistor 960C is connected to an anode power line 961C, and the drain electrode of the drive transistor 960C is connected to one end of the light emitting element DO. The other end of the light emitting element DO is connected to a cathode electrode 963C. The gate electrode of the driving transistor 960C is connected to the drain electrode of the selection transistor 970C. The storage capacitor 980C is connected to the gate electrode and the drain electrode of the drive transistor 960C. A gradation signal for determining the light emitting intensity of the light emitting element DO is supplied to the signal line 971C. A signal for selecting a pixel row in which the gradation signal described above is written is supplied to the gate line 973C.

[Cross-Sectional Structure of Display Device 20C]

FIG. 24 is a cross-sectional view of a display device according to an embodiment of the present invention. Although the structure of the display device 20C shown in FIG. 24 is similar to the display device 20B shown in FIG. 21, the structure above an insulating layer 354C of the display device 20C is different from the structure above the second insulating layer 354B of the display device 20B. Hereinafter, in the structure of the display device 20C shown in FIG. 24, an explanation of the same structure as the display device 20B shown in FIG. 21 is omitted, and differences from the display device 20B are explained.

As is shown in FIG. 24, the display device 20C includes a pixel electrode 981C, a light emitting layer 983C, and a common electrode 985C above the insulating layer 354C. The pixel electrode 981C is provided on the insulating layer 354C and inside a third aperture 871C. An insulating layer 358C is provided above the pixel electrode 981C. An aperture 359C is arranged in the insulating layer 358C. The aperture 359C corresponds to a light emitting region. That is, the insulating layer 358C defines a pixel. The light emitting layer 983C and the common electrode 985C are provided above the pixel electrode 981C exposed by the aperture 359C. The pixel electrode 981C and the light emitting layer 983C are individually provided for each pixel. On the other hand, the common electrode 985C is arranged in common for a plurality of pixels. Different materials are used for the light emitting layer 983C depending on the display color of the pixel.

In the third embodiment and fourth embodiment, although a structure was exemplified in which the semiconductor device explained in the first embodiment and the second embodiment were applied to a liquid crystal display device and an organic EL display device, display devices other than these display devices (for example, a self-luminous display device or an electronic paper display device other than an organic EL display device) may also be applied with the semiconductor device. In addition, the semiconductor device described above can be applied without any particular limitation from a small sized display device to a large sized display device.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:
1. A semiconductor device comprising:
   an oxide semiconductor layer including indium;
   a gate electrode facing the oxide semiconductor layer;
   a gate insulating layer between the oxide semiconductor layer and the gate electrode; and
   a first electrode arranged above the oxide semiconductor layer and being in contact with the oxide semiconductor layer from above the oxide semiconductor layer,
   wherein indium is unevenly distributed in an unevenly distributed region among the oxide semiconductor layer,
   the unevenly distributed region overlapping with a first conductive layer in a planar view,
   a part of the oxide semiconductor layer overlapping with the first electrode in a planar view includes a first region arranged in a side of the first electrode and a second region arranged in a side closer to the gate electrode than the first region, and a crystal particle size of indium unevenly distributed in the second region is larger than a crystal particle size of indium unevenly distributed in the first region.

2. The semiconductor device according to claim 1, wherein the gate electrode and the gate insulating layer are arranged below the oxide semiconductor layer.

3. The semiconductor device according to claim 1, wherein the unevenly distributed region includes a dense region and a lack region,
a density of indium in the dense region is larger than a density of indium in an exposed region exposed from the first electrode in a planar view,
a density of indium in the lack region is smaller than a density of indium in the exposed region, and
the densities of indium are measured by a mapping analysis of Energy Dispersive X-ray spectrometry.

4. The semiconductor device according to claim 1, wherein a part of the oxide semiconductor layer overlapping with the first electrode in a planar view includes a first region arranged in a side of the first electrode and a second region arranged in a side closer to the gate electrode than the first region, and
a size of a high concentration region of indium unevenly distributed in the second region is larger than a size of a high concentration region of indium unevenly distributed in the first region.

5. The semiconductor device according to claim 4, wherein a part of the oxide semiconductor layer overlapping with the first electrode in a planar view includes a third region arranged between the second region and a region exposed from the first electrode in a planar view,
indium in the third region exists more evenly than indium in each of the first region and the second region,
the third region is continued to a region exposed from the first electrode in a planar view,
the third region contains a square in a cross sectional view, and
a length of a side of the square is longer than a half of thickness of the oxide semiconductor layer in a region overlapping with the first electrode in a planar view.

6. The semiconductor device according to claim 5, wherein a part of the oxide semiconductor layer overlapping with the first electrode in a planar view includes a third region arranged between the second region and a region exposed from the first electrode in a planar view,
indium in the third region exists more evenly than indium in each of the first region and the second region,
the third region is continued to a region exposed from the first electrode in a planar view,
the third region contains a square in a cross sectional view, and
a length of a side of the square is longer than a half of thickness of the oxide semiconductor layer in a region overlapping with the first electrode in a planar view.

7. A semiconductor device comprising:
an oxide semiconductor layer including indium;
a gate electrode facing the oxide semiconductor layer;
a gate insulating layer between the oxide semiconductor layer and the gate electrode; and
a first electrode arranged above the oxide semiconductor layer and being in contact with the oxide semiconductor layer from above the oxide semiconductor layer,
wherein indium is unevenly distributed in an unevenly distributed region among the oxide semiconductor layer,
the unevenly distributed region overlapping with a first conductive layer in a planar view,
a part of the oxide semiconductor layer overlapping with the first electrode in a planar view includes a first region arranged in a side of the first electrode and a second region arranged in a side closer to the gate electrode than the first region,
a size of a region in which a signal intensity due to indium in the second region is relatively larger than a size of a region in which a signal intensity due to indium in the first region, and
the signal intensities are measured by a mapping analysis of Energy Dispersive X-ray spectrometry.

8. The semiconductor device according to claim 7, wherein a part of the oxide semiconductor layer overlapping with the first electrode in a planar view includes a third region arranged between the second region and a region exposed from the first electrode in a planar view,
indium in the third region exists more evenly than indium in each of the first region and the second region,
the third region is continued to a region exposed from the first electrode in a planar view,
the third region contains a square in a cross sectional view, and
a length of a side of the square is longer than a half of thickness of the oxide semiconductor layer in a region overlapping with the first electrode in a planar view.

* * * * *